US 9,006,718 B2

(12) United States Patent
Mizusaki et al.

(10) Patent No.: US 9,006,718 B2
(45) Date of Patent: Apr. 14, 2015

(54) ORGANIC ELECTROLUMINESCENCE DISPLAY PANEL AND MANUFACTURING METHOD

(75) Inventors: Naoko Mizusaki, Osaka (JP); Kenichi Nendai, Hyogo (JP)

(73) Assignee: Panasonic Corporation, Osaka (JP)

( * ) Notice: Subject to any disclaimer, the term of this patent is extended or adjusted under 35 U.S.C. 154(b) by 56 days.

(21) Appl. No.: 13/818,403

(22) PCT Filed: Jul. 5, 2012

(86) PCT No.: PCT/JP2012/004369
§ 371 (c)(1),
(2), (4) Date: Feb. 22, 2013

(87) PCT Pub. No.: WO2013/031076
PCT Pub. Date: Mar. 7, 2013

(65) Prior Publication Data
US 2013/0328024 A1    Dec. 12, 2013

(30) Foreign Application Priority Data

Sep. 2, 2011   (JP) .................. 2011-191563
Dec. 12, 2011  (JP) .................. 2011-271330

(51) Int. Cl.
*H01L 51/50*   (2006.01)
*H05B 33/10*   (2006.01)
*H01L 51/52*   (2006.01)
*H01L 27/32*   (2006.01)

(52) U.S. Cl.
CPC ............ *H01L 51/5008* (2013.01); *H05B 33/10* (2013.01); *H01L 51/5212* (2013.01); *H01L 27/3246* (2013.01)

(58) Field of Classification Search
CPC ... H01L 23/296; H01L 27/3246; H01L 27/32; H01L 27/3225
USPC .......................................... 313/506
See application file for complete search history.

(56) References Cited

U.S. PATENT DOCUMENTS

| 5,443,922 A | 8/1995 | Nishizaki et al. |
| 7,679,284 B2 * | 3/2010 | Kubota ................. 313/506 |
| 2005/0057151 A1 | 3/2005 | Kuwabara |
| 2006/0125390 A1 * | 6/2006 | Oh ........................ 313/506 |
| 2007/0029929 A1 | 2/2007 | Nakamura et al. |
| 2010/0084646 A1 | 4/2010 | Matsusue et al. |

(Continued)

FOREIGN PATENT DOCUMENTS

| JP | 05-163488 | 6/1993 |
| JP | 2004-127933 | 4/2004 |

(Continued)

*Primary Examiner* — Marc Armand
*Assistant Examiner* — Quinton Brasfield
(74) *Attorney, Agent, or Firm* — Greenblum & Bernstein, P.L.C.

(57) ABSTRACT

A organic EL display panel and similar are provided so as to constrain a gradual increase in contact resistance between a common electrode and a power supply layer. In a panel including a substrate, a pixel electrode, a power supply layer formed with separation from the pixel electrode, a resin partition layer having an aperture over the power supply layer and over the pixel electrode, an organic light-emitting layer, a functional layer in contact with the organic light-emitting layer in the aperture and electrically connected to the power supply layer, and a common electrode, an inorganic film is disposed between the functional layer and side walls of an opening for the aperture over the power supply layer in the resin partition layer.

14 Claims, 17 Drawing Sheets

(56) References Cited

U.S. PATENT DOCUMENTS

| | | |
|---|---|---|
| 2010/0156273 A1 | 6/2010 | Utsunomiya et al. |
| 2010/0302221 A1 | 12/2010 | Okumoto |
| 2011/0027616 A1* | 2/2011 | Kashiwabara et al. ....... 428/690 |
| 2011/0058119 A1* | 3/2011 | Shiratori et al. ................ 349/61 |
| 2012/0268002 A1 | 10/2012 | Osako et al. |

FOREIGN PATENT DOCUMENTS

| | | |
|---|---|---|
| JP | 2005-038833 | 2/2005 |
| JP | 2005-149800 | 6/2005 |
| JP | 2005-158493 | 6/2005 |
| JP | 2006-171745 | 6/2006 |
| JP | 2007-073499 | 3/2007 |
| JP | 2010-153070 | 7/2010 |
| JP | 2011-040167 | 2/2011 |
| JP | 2011040167 A * | 2/2011 |
| WO | 2009/110186 | 9/2009 |
| WO | 2010/070798 | 6/2010 |
| WO | 2011/045911 | 4/2011 |

* cited by examiner

Entries 1-7

Entry 8

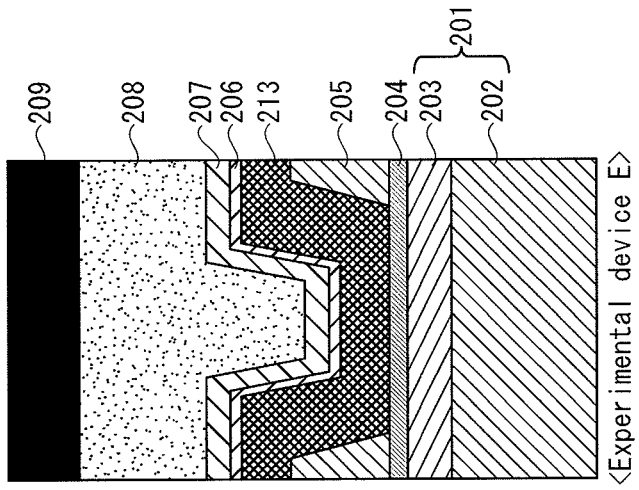
FIG. 10A Entries 9, 10
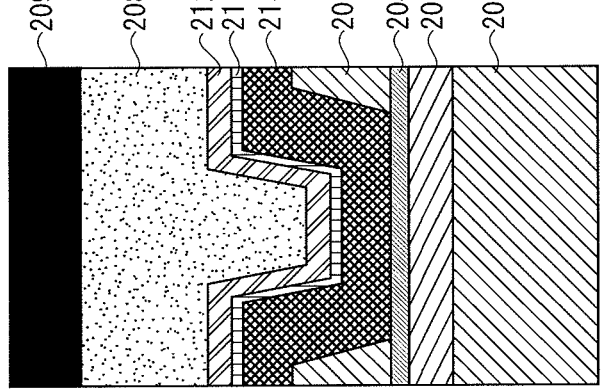
FIG. 10B Entry 11
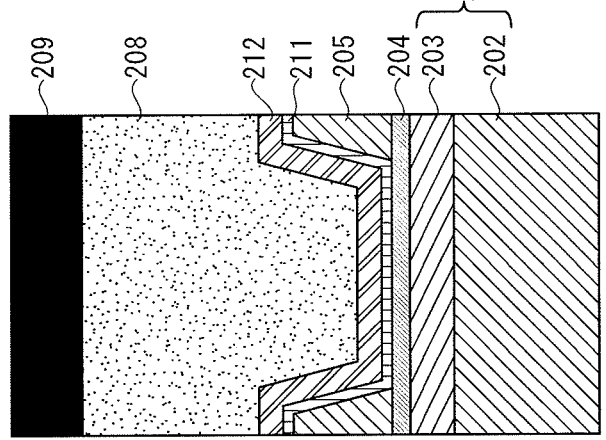
FIG. 10C Entry 12

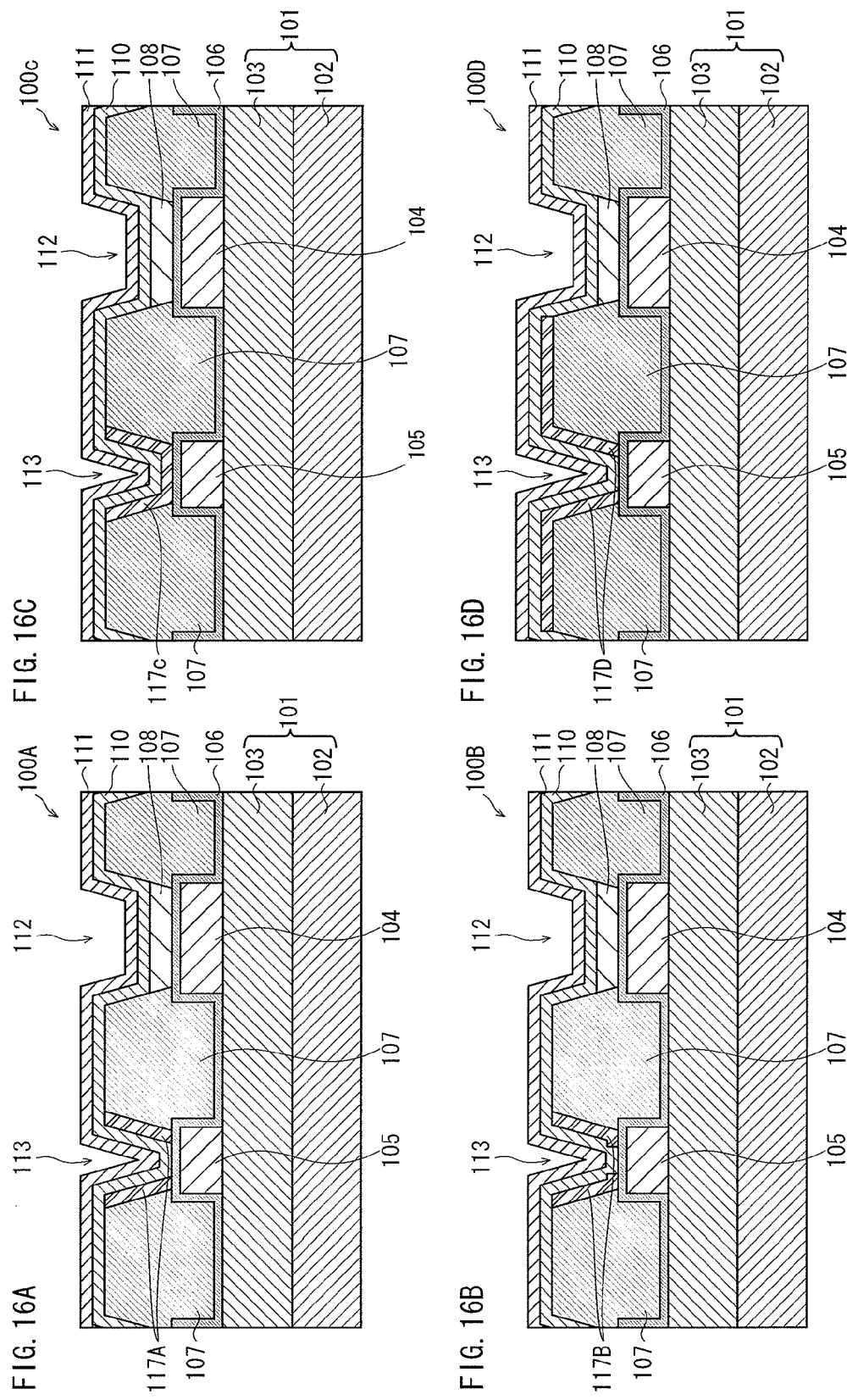

ORGANIC ELECTROLUMINESCENCE DISPLAY PANEL AND MANUFACTURING METHOD

TECHNICAL FIELD

The present invention relates to an organic electroluminescence display panel and to a manufacturing method therefor.

BACKGROUND ART

In recent years, organic electroluminescence display panels in which organic electroluminescence elements are disposed on a substrate. The organic electroluminescence display panel (hereinafter, organic EL display panel) achieves high visibility through the use of auto-luminous organic EL elements, and is also highly shock-resistant given that the elements are completely solid units. Each of the organic EL elements is a current-driven light-emitting diode configured such that an organic light-emitting layer or similar employs the phenomenon of organic material electroluminescence to produce light by recombination of carriers between a pair of electrodes, namely an anode (e.g., a pixel electrode) and a cathode (e.g., a common electrode).

Among organic EL display panels, top-emission panels, in which light is emitted from the cathode side, are the focus of attention in terms of attempts to improve the brilliance by making effective use of the light emitted from the organic light-emitting layer. In such a organic EL display panel, the cathode is a transparent electrode material such as indium tin oxide or indium zinc oxide spread over the entirety of the surface area. However, the transparent electrode material is highly resistive relative to metals. As such, a problem arises in that decreasing voltage toward the centre of the display area causes a decrease in current supplied to the organic EL elements, and in turn leads to degradation in display quality. An organic EL display panel has been proposed in which the organic EL elements are disposed between the cathode and a power supply layer connected thereto (see, for example, Patent Literature 1 and 2). Here, the power supply layer is a term designating a low-resistance wire supplying power from a power supply to the cathode, also termed an auxiliary wire.

FIG. 17 is a partial cross-sectional diagram illustrating a sample configuration of an organic EL display panel 90 having a power supply layer. A hole injection layer 904 is formed so as to cover a pixel electrode 902 and a power supply layer 903, which are formed with separation over a substrate 901. The power supply layer 903 and the hole injection layer 904 serve as the power supply layer. A resin partition layer 905 having apertures over each of the pixel electrode 902 and the power supply layer 903 is provided over the power supply layer. An organic light-emitting layer 906 is formed in the apertures over the pixel electrode 902. A functional layer 907 and a common electrode 908 are then sequentially layered thereon.

The functional layer 907 is provided with the aim of encouraging electron injection from the common electrode 908 to the organic light-emitting layer 906. Known materials used for the functional layer 907 is, for example, an organic material with electron injection capabilities mixed with an alkali metal or with an alkali earth metal.

CITATION LIST

Patent Literature

[Patent Literature 1]
  Japanese Patent Application Publication No. 2010-153070
[Patent Literature 2]
  Japanese Patent Application Publication No. 2007-73499

SUMMARY OF INVENTION

Technical Problem

A way of constraining the gradual increase in contact resistance between the power supply layer and the common electrode in the organic EL display panel configuration shown in FIG. 17 is being sought.

The present disclosure aims to provide a organic EL display panel and the like in which the gradual increase in contact resistance between the power supply layer and the common electrode is constrained.

Solution to Problem

An organic electroluminescence display panel of one aspect of the disclosure has an organic light-emitting layer disposed between a pair of electrodes that includes a pixel electrode and a common electrode, the organic electroluminescence display panel comprising: a substrate; the pixel electrode, formed over the substrate; a power supply layer supplying electric power to the common electrode, formed over the substrate with separation from the pixel electrode; a resin partition layer partitioning a formation area for the organic light-emitting layer, disposed over the substrate and having an opening over the pixel electrode and an opening over the power supply layer; the organic light-emitting layer, formed in the opening over the pixel electrode so as to cover a portion of the pixel electrode exposed through the opening over the pixel electrode; a functional layer in contact with the organic light-emitting layer and electrically connected to a portion of the power supply layer exposed through the opening over the power supply layer, formed so as to cover the resin partition layer; and the common electrode, formed over the functional layer, wherein an inorganic film is disposed between the functional layer and side walls of the opening over the power supply layer.

Advantageous Effects of Invention

According to the organic EL display panel pertaining to one aspect of the present disclosure, the gradual increase in contact resistance between the power supply layer and the common electrode is constrained.

BRIEF DESCRIPTION OF DRAWINGS

FIGS. 10A, 10B, and 10C are cross-sectional diagrams of experimental devices C, D, and E.

FIGS. 16A, 16B, 16C, and 16D are partial cross-sections illustrating the configuration of an organic EL display panel pertaining to a variation of Embodiment 3.

DESCRIPTION OF EMBODIMENTS (Overview of Aspects)

Figure 1:
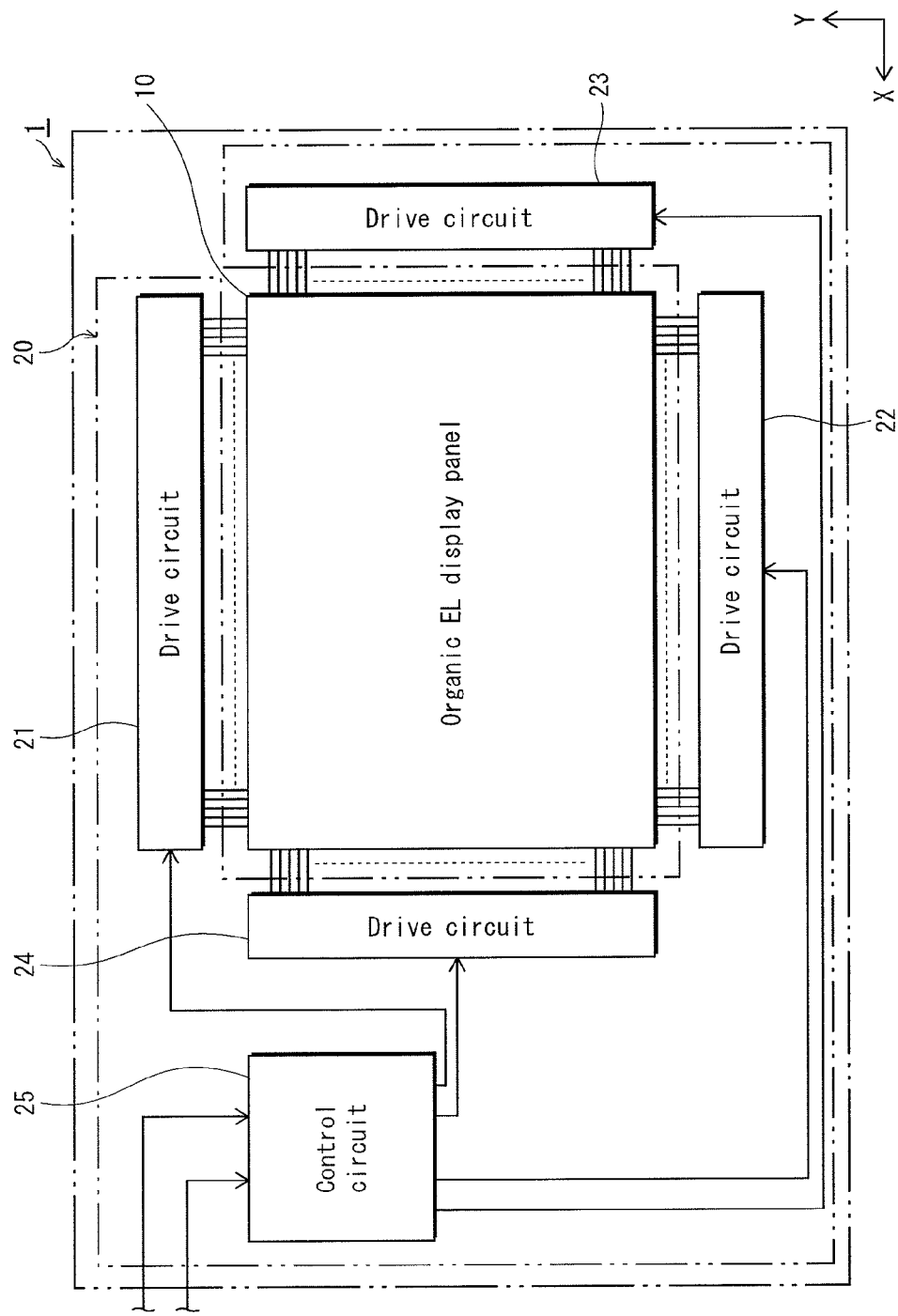
FIG. 1 illustrates the overall configuration of an organic electroluminescence display device 1 pertaining to Embodiment 1.

In one aspect, an organic electroluminescence display panel having an organic light-emitting layer disposed between a pair of electrodes that includes a pixel electrode and a common electrode, the organic electroluminescence display panel comprising: a substrate; the pixel electrode, formed over the substrate; a power supply layer supplying electric power to the common electrode, formed over the substrate with separation from the pixel electrode; a resin partition layer partitioning a formation area for the organic light-emitting layer, disposed over the substrate and having an opening over the pixel electrode and an opening over the power supply layer; the organic light-emitting layer, formed in the opening over the pixel electrode so as to cover a portion of the pixel electrode exposed through the opening over the pixel electrode; a functional layer in contact with the organic light-emitting layer and electrically connected to a portion of the power supply layer exposed through the opening over the power supply layer, formed so as to cover the resin partition layer; and the common electrode, formed over the functional layer, wherein an inorganic film is disposed between the functional layer and side walls of the opening over the power supply layer.

In a further aspect of the organic electroluminescence display panel, the inorganic film further extends from the side walls of the opening over the power supply layer to a top face of the power supply layer.

In another aspect of the organic electroluminescence display panel, the inorganic film further extends from the side walls of the opening over the power supply layer to a top face of the resin partition layer.

In an alternate aspect of the organic electroluminescence display panel, a material forming the inorganic film is a conducting material, and the inorganic film further extends from the side walls of the opening over the power supply layer to a top face of the power supply layer so as to entirely cover the portion of the power supply layer exposed through the opening over the power supply layer.

In another further aspect of the organic electroluminescence display panel, the inorganic film further extends from the side walls of the opening over the power supply layer to a top face of the resin partition layer.

In yet a further aspect of the organic electroluminescence display panel, a material forming the functional layer is at least one of oxidable and hygroscopic, and a material forming at least a portion of the inorganic film that is in contact with the resin partition layer is more oxidable than the material forming the functional layer when the material forming the functional layer is oxidable, and more hygroscopic than the material forming the functional layer when the material forming the functional layer is hygroscopic.

In still a further aspect of the organic electroluminescence display panel, the functional layer includes an alkali metal or an alkali earth metal, and the material forming at least a portion of the inorganic film that is in contact with the resin partition layer oxides more easily in the presence of oxygen or water than the material forming the functional layer.

In still yet a further aspect of the organic electroluminescence display panel, the material forming at least a portion of the inorganic film that is in contact with the resin partition layer includes any of aluminium, silver, copper, and magnesium.

In a further alternate aspect of the organic electroluminescence display panel, the functional layer is an electron injection layer.

In yet another alternate aspect of the organic electroluminescence display panel, a hole injection layer disposed between the pixel electrode and the organic light-emitting layer, wherein the power supply layer includes: a wire formed over the substrate; and a layer of a material similar to the hole injection layer, formed so as to cover the wire.

In one aspect of a manufacturing method for an organic electroluminescence display panel having an organic light-emitting layer disposed between a pair of electrodes that includes a pixel electrode and a common electrode, the manufacturing method comprises: a step of preparing a substrate; a step of forming the pixel electrode over the substrate; a step of forming a power supply layer supplying electric power to the common electrode, over the substrate so as to be separate from the pixel electrode; a step of forming a resin partition layer partitioning a formation area for the organic light-emitting layer, over the substrate so as to have an opening over the pixel electrode and an opening over the power supply layer; a step of forming the organic light-emitting layer in the opening over the pixel electrode so as to cover a portion of the pixel electrode exposed through the opening over the pixel electrode; a step of forming a functional layer in contact with the organic light-emitting layer and electrically connected to a portion of the power supply layer exposed through the opening over the power supply layer, so as to cover the resin partition layer, a step of forming the common electrode over the functional layer; and a step of disposing an inorganic film between the functional layer and side walls of the opening over the power supply layer, performed after the step of forming the resin partition layer and before the step of forming the functional layer.

In another aspect of a manufacturing method for an organic electroluminescence display panel, the inorganic film is formed so as to further extend from the side walls of the opening over the power supply layer to a top face of the power supply layer.

In a further aspect of a manufacturing method for an organic electroluminescence display panel, the inorganic film is formed so as to further extend from the side walls of the opening over the power supply layer to a top face of the resin partition layer.

In an alternate aspect of a manufacturing method for an organic electroluminescence display panel, a material forming the inorganic film is a conducting material, and the inorganic film is formed so as to further extend from the side walls of the opening over the power supply layer to a top face of the power supply layer so as to entirely cover the portion of the power supply layer exposed through the opening over the power supply layer.

In another alternate aspect of a manufacturing method for an organic electroluminescence display panel, the inorganic film is formed so as to further extend from the side walls of the opening over the power supply layer to a top face of the resin partition layer.

In a further alternate aspect of a manufacturing method for an organic electroluminescence display panel, the step of forming the inorganic film is performed after the step of forming the organic light-emitting layer.

In yet another alternate aspect of a manufacturing method for an organic electroluminescence display panel, the step of forming the inorganic film is performed before the step of forming the organic light-emitting layer.

In still a further aspect of a manufacturing method for an organic electroluminescence display panel, the step of forming the resin partition layer includes a step of heating the resin partition layer.

In another further aspect of a manufacturing method for an organic electroluminescence display panel, in the step of forming the inorganic film, the inorganic film is formed on a substrate as finished after the step of forming the resin partition layer, by vapour deposition of an inorganic material for the inorganic film over a masque having an opening in a portion corresponding to a predetermined region of formation for the inorganic film.

In an alternate further aspect of a manufacturing method for an organic electroluminescence display panel, in the step of forming the inorganic film, the inorganic film is formed by forming a layer of an inorganic material for the inorganic film over an entire top face of a substrate as finished after the step of forming the resin partition layer, and then removing all portions of the layer of the inorganic material not corresponding to a predetermined region of formation for the inorganic film.

In an alternative aspect of a manufacturing method for an organic electroluminescence display panel, a step of disposing a hole injection layer between the pixel electrode and the organic light-emitting layer, wherein the step of forming the power supply layer includes: a step of forming a wire over the substrate; and a step of forming a layer of a material similar to the hole injection layer so as to cover the wire, and the step of forming the pixel electrode and the step of forming the wire are performed as a single step.

(Embodiment 1)
[Organic Electroluminescence Display Device]

FIG. 1 illustrates the overall configuration of an organic electroluminescence display device (hereinafter, organic EL display device) 1 pertaining to Embodiment 1.

As shown, the organic EL display device includes an organic EL display panel 10 pertaining to an aspect of the disclosure, as well as a drive control unit 20 connected thereto. The organic EL display device 1 is used in a display screen, a television, a mobile phone, or similar. The organic EL display panel 10 is a panel employing the phenomenon of organic material electroluminescence, in which a plurality of organic EL elements are arranged as a matrix in the X-Y plane. The drive control unit 20 includes four drive circuits 21-24 and a control circuit 25. No limitation is intended to the actual organic EL display device 1 regarding the arrangement of and connections between the organic EL display panel 10 and the drive control unit 20.

[Organic Electroluminescence Display Panel]

Figure 2A:
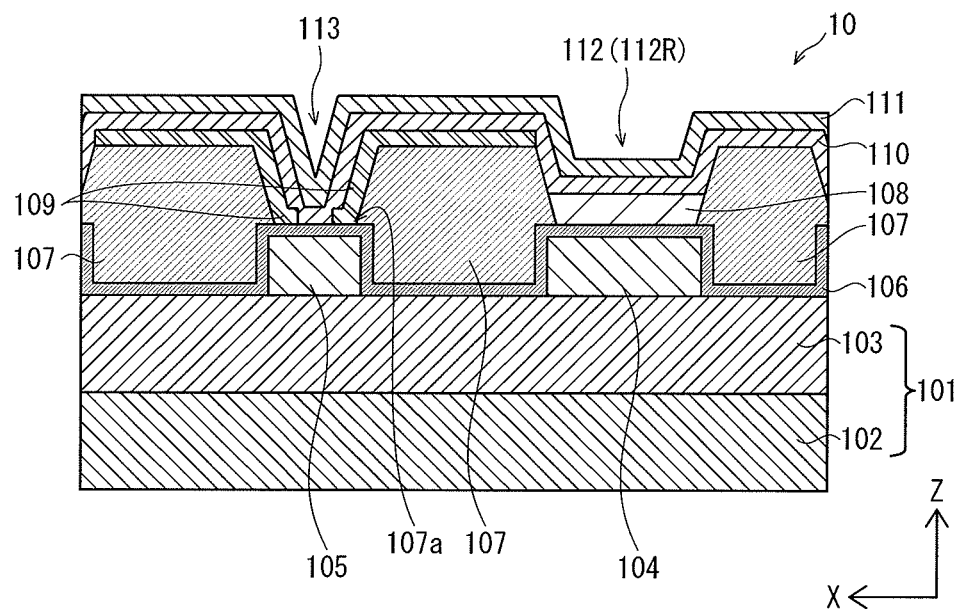
FIG. 2A is a partial cross-sectional diagram showing the configuration of an organic EL display panel 10 pertaining to Embodiment 1.

FIG. 2A is a partial cross-section illustrating the configuration of the organic EL display panel pertaining to Embodiment 1.

The organic EL display panel 10 is a top emission panel in which the display face is the top face indicated in FIG. 2A. The organic EL display panel 10 has sub-pixels in the form of organic EL elements each having an organic light-emitting layer 8 corresponding to an emitted colour that is one of red (R), green (G), and blue (B). The sub-pixels are arranged in a matrix.

The principal configuration of the organic EL display panel 10 includes a substrate 101, a pixel electrode (anode) 104, an auxiliary wire 105, a hole injection layer 106, a resin partition layer 107, the organic light-emitting layer 108, an inorganic film 109, an electron injection layer 110, and a common electrode (cathode) 111.

(Substrate 101)

The substrate 101 corresponds to a substrate on which the pixel electrode is formed, and includes a thin-film transistor (hereinafter, TFT) substrate 102 and an inter-layer insulation film 103.

The TFT substrate 102 serves as the back substrate for the organic EL display panel 10, and is formed of an insulating material such as a non-alkali glass, a soda glass, a non-fluorescent glass, a phosphoric glass, a boric gas, quartz, an acrylic resin, a styrene resin, a polycarbonate resin, an epoxy resin, a polyethylene resin, a polyester resin, a silicone resin, aluminium oxide, and so on.

A thin-film transistor is formed over the surface of the TFT substrate 102 so as to drive the organic EL display panel 10 as an active drive matrix. The TFT is prepared using silicon, a semiconductor oxide such as indium-gallium-zinc oxide, an organic semiconductor such as a pentacene, or the like as the channel material.

The inter-layer insulation film 103 is formed from an insulating material such as a polyimide resin or an acrylic resin.

(Pixel Electrode 104)

The pixel electrode (anode) 104 is formed over the substrate 101. The pixel electrode 104 is, for example, formed of APC (an alloy of silver, palladium, and copper), ARA (an alloy of silver, rubidium, and gold), MoCr (an alloy of molybdenum and chrome), NiCr (an alloy of nickel and chrome), or similar. The pixel electrode 104 is formed as a matrix in the X-Y plane so as to correspond to the sub-pixels.

(Auxiliary Wire 105)

The auxiliary wire 105 is formed over the substrate 101 with some separation from the pixel electrode (anode) 104. The auxiliary wire 105 corresponds to wiring formed over the substrate. The auxiliary wire 105 may be formed using material identical to that used for the pixel electrode 104. In the present Embodiment, the pixel electrode 104 and the auxiliary wire 105 are formed from the same material, and are further formed in a single manufacturing step. The auxiliary wire 105 is arranged such that one piece of wire is disposed every three sub-pixels. Each piece of the auxiliary wire 105 extends along the Y dimension (shown as the depth direction in FIG. 2A).

(Hole Injection Layer 106)

The hole injection layer 106 is formed over the substrate 101, the pixel electrode (anode) 104, and the auxiliary wire 105. The hole injection layer 106 is provided with the goal of promoting hole injection from the pixel electrode 104 into the organic light-emitting layer 108. The hole injection layer 106 is formed of a material such as, for example, an oxide of silver (Ag), molybdenum (Mo), chromium (Cr), vanadium (V), tungsten (W), nickel (Ni), iridium (Ir), or similar, or a conducting polymer material such as PEDOT (a compound of polythiophene and polystyrene sulfonate acid).

Also, an indium-tin oxide (hereinafter, ITO) layer or an indium-zinc oxide (hereinafter, IZO) layer may be provided between the pixel electrode 104 and the hole injection layer 106 so as to improve connectivity between these layers. The same applies to the auxiliary wire 105 and the hole injection layer 106.

Furthermore, the hole injection layer 106 and the auxiliary wire 105 jointly form a power supply layer supplying electric power to the common electrode 111. Also, when the ITO (or IZO) layer is provided between the auxiliary wire 105 and the hole injection layer 106, the power supply layer is formed by the three components, i.e., by the auxiliary wire 105, the hole injection layer 106, and the ITO (or IZO) layer.

(Resin Partition Layer 107)

The resin partition layer 107 is formed over the hole injection layer 106. The resin partition layer 107 has a primary purpose of defining formation regions for the organic light-emitting layer 108, and has a secondary purpose of securing connective regions for electrically connecting the auxiliary wire 105 to the common electrode 111. The resin partition layer 107 is formed so as to have a uniform trapezoidal cross-section, from an insulating organic material (e.g., an acrylic resin, a polyimide resin, a novolac-type phenol resin, or the like).

Figure 2B:
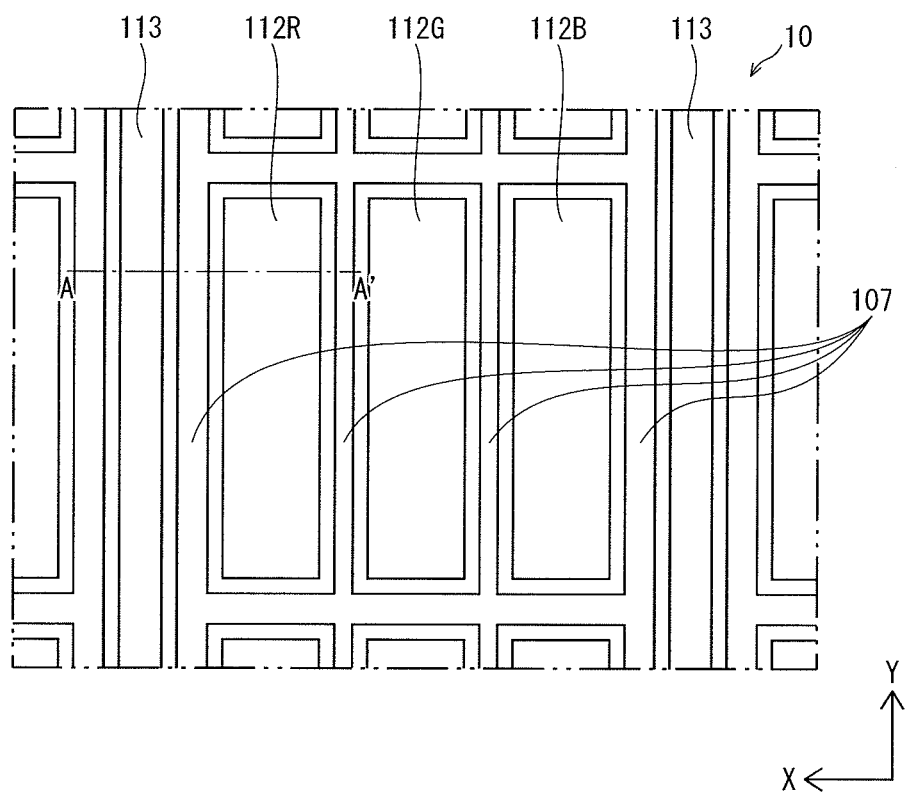
FIG. 2B is a partial plane view showing the shape of resin partition layer 107 therein.

FIG. 2B is a partial plane view illustrating the shape of the resin partition layer 107 of the organic EL display panel 10. The partial cross-section shown in FIG. 2A is taken along line A-A' of FIG. 2B.

As shown, apertures 112R, 112G, and 112B are formed in the resin partition layer 107 and above the pixel electrode 104. Each of the apertures 112R, 112G, and 112B is rectangular when viewed in a plane view. The apertures 112R, 112G, and 112B respectively correspond to areas where the organic light-emitting layer 108 is to be formed corresponding to red emitted light, to green emitted light, and to blue emitted light. That is, each of the apertures 112R, 112G, and 112B defines one of the sub-pixels. A combination of an R sub-pixel, a G sub-pixel, and a B sub-pixel makes up a single pixel.

Also, the apertures 113 are formed above the auxiliary wire 105 and extend in the Y dimension. The auxiliary wire 105 and the common electrode 111 are electrically connected within the apertures 113. Here, the apertures 112R, 112G, and 112B formed in the resin partition layer are defined so as to each include the side walls of an opening formed in the resin partition layer 107 and the space defined by the side walls of the opening. Also, each opening formed in the resin partition layer 107 is a space formed and defined by the side walls of the opening.

(Organic Light-Emitting Layer 108)

As FIG. 2A shows, the organic light-emitting layer 108 is formed within the aperture 112R in the resin partition layer 107 so as to cover portions of the pixel electrode 104 exposed by the aperture 112R. The organic light-emitting layer 108 emits light through the reunion of charge carriers (i.e., the holes and the electrons). The organic light-emitting layer 108 formed within the aperture 112 as shown in FIG. 2A is formed so as to include organic material for red light. Here, the organic light-emitting layer formed so as to cover the portions of the pixel electrode exposed by the aperture also encompasses portions of the organic light-emitting layer formed between the pixel electrode and any other layer.

The material used as the organic light-emitting layer 108 is beneficially poly(p-phenylene vinylene) (hereinafter, PPV), polyfluorene, or one of the materials cited in Japanese Patent Application Publication No. H5-163488, such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, metal complex of an 8-hydroxyquinoline compound, metal complex of a 2-bipyridine compound, complex of a Schiff base and a group three metal, metal complex of oxine, rare earth metal complex, and so on.

(Inorganic Film 109)

The inorganic film 109 is formed of an inorganic material over the side walls of the aperture 113 in the resin partition layer 107 over the auxiliary wire 105. The inorganic film 109 is provided with the goal of suppressing gradual deterioration in the electron injection layer 110 caused by gaseous impurities (i.e., by outgassing) that include water, organic material, and so on, occurring in the resin that forms the resin partition layer 107. Thus, the inorganic film 109 is formed between the side walls of the aperture 113 and the electron injection layer 110. Providing the inorganic film 109 between the resin partition layer 107 and the electron injection layer 110 enables the gradual increase in contact resistance between the auxiliary wire 105 and the common electrode 111 to be suppressed. The gradual deterioration of the electron injection layer 110 includes situations where, for example, the electron injection layer 110 slowly deteriorates during the manufacturing process that continues after electron injection layer 110 formation, where the electron injection layer 110 slowly deteriorates as the organic EL display panel 10 is used, and so on.

An inorganic material having superb sealing properties is beneficial for the inorganic film 109. Examples of such a material include silicon monoxide (SiO), silicon mononitride (SiN), silicon oxynitride (SiON), a metallic film of aluminium (Al), silver (Ag), copper (Cu), magnesium (Mg), or similar, ITO, IZO, sodium fluoride (NaF), aluminium with sodium fluoride (NaF/Al), and so on. The material used for the inorganic film 109 may be either a conductor or an insulator.

The inorganic film 109 is formed with the aim of constraining the deterioration of the portion of the electron injection layer 110 that is electrically connected to the auxiliary wire 105. Accordingly, the deterioration of the electron injection layer 110 is effectively constrained by separating the portion of the electron injection layer 110 in which the opening and side walls forming an aperture 113 are formed from the resin partition layer 107. Therefore, the inorganic film 109 has an aperture 113 formed therein with an opening and side walls above the auxiliary wire 105, in contrast to the aperture 112 formed above the pixel electrode 104 in the resin partition layer 107.

Another reason for not forming the side walls of the aperture 112 in the inorganic film 109 above the pixel electrode 104 is as follows. During the organic light-emitting layer 108 formation step, the resin partition layer 107 is made to include a water-repellent material because of the need to adequately hold ink, which contains the organic light-emitting layer material and a solvent, within the apertures 112 above the pixel electrode 104. The opening and side walls for the apertures 112 are not formed in the inorganic film 109 in order to prevent damage to the water repellence of the side walls of the apertures 112 serving as the organic light-emitting layer 108 formation regions.

In the present Embodiment, the inorganic film 109 extends from the side walls of the opening for the aperture 113 above the auxiliary wire 105 to the top face of the resin partition layer 107. Thus, a portion of the top surface of the resin partition layer 107 is covered by the inorganic film 109. Accordingly, any deterioration of the electron injection layer 110 caused by the outgassing produced in the vicinity of the top face of the resin partition layer 107 between the aperture 112 and the aperture 113 is suppressed. As a result, the deterioration of the electron injection layer 110 is prevented from reaching the vicinity of the electron injection layer 110 formed in the side walls of the opening for the aperture 113 (i.e., the portion electrically connected to the auxiliary wire 105).

Furthermore, as indicated in FIG. 2A, the inorganic film 109 extends from the opening for the aperture 113 over the auxiliary wire 105 to the top face of the hole injection layer 106 (i.e., the top face of the power supply layer) and thus covers an edge portion 107a of the resin partition layer 107. Thus, during the manufacturing process for the organic EL display panel 10, contact between the edge portion 107a of the resin partition layer 107 and the electron injection layer 110 is prevented despite any mechanical discrepancy in the position at which the inorganic film 109 is formed.

The thickness of the inorganic film 109 is not particularly limited provided that the thickness is sufficient for blocking any outgassing from the resin partition layer 107. For example, the thickness may range from 10 nm to 200 nm.

(Electron Injection Layer 110)

The electron injection layer 110 is formed so as to cover the resin partition layer 107, the organic light-emitting layer 108, and the inorganic film 109. The electron injection layer 110 corresponds to the functional layer of the disclosure. The electron injection layer 110 is provided in order to promote the injection of electrons from the common electrode 111 into the organic light-emitting layer 108. Thus, the electron injection layer 110 is in contact with the organic light-emitting layer 108 within the aperture 112 above the pixel electrode 104. The electron injection layer 110 is formed so as to be electrically connected to the portion of the hole injection layer 106 exposed through the aperture 113 above the auxiliary wire 105.

Here, forming the electron injection layer 110 so as to be electrically connected to the hole injection layer 106 includes situations where the electron injection layer 110 and the hole injection layer 106 are in direct contact as well as situations where the electron injection layer 110 and the hole injection layer 106 are connected via a conducting material. When the material used for the inorganic film 109 is non-conducting, then as shown in FIG. 2A, the electron injection layer 110 and the hole injection layer 106 are in direct contact. That is, the inorganic film 109 must be parted over the hole injection layer 106. When the material used for the inorganic film 109 is conducting, then the electron injection layer 110 and the hole injection layer 106 need not necessarily be in direct contact, and may be separated by, for example, the inorganic film 109 and other conducting materials.

The material for the electron injection layer 110 is an organic material with electron injection capabilities mixed with an alkali metal or with an alkali earth metal. In the present Embodiment, barium (Ba) is used as the metal. Alternatively, a material having excellent electron injection capabilities listed in Japanese Patent Application Publication No. H5-163488 may be used, such as a nitro-substituted fluorenone derivative, a thiopyran dioxide derivative, a diphenoquinone derivative, a perylene tetracarboxyl derivative, an anthraquinodimethane derivative, a fluoronylidene methane derivative, an anthrone derivative, an oxadiazole derivative, a perinone derivative, and a quinoline complex derivative.

(Common Electrode 111)

The common electrode (cathode) 111 is formed over the entire surface of the electron injection layer 110. The organic EL display panel 10 is a top-emission panel. Thus, a transparent conducting material such as the aforementioned ITO and IZO is used for the common electrode 111.

(Other)

A sealing layer is provided over the common electrode 111 with the aim of constraining deterioration in the organic light-emitting layer 108 due to contact with water and with the outside atmosphere. Given that the organic EL display panel 10 is a top-emission panel, the material for the sealing layer is, for example, an optically transparent material such as SiN or SiON.

(Experiments and Discussion)

As described above, the inorganic film 109 is disposed between the resin partition layer 107 and the electron injection layer 110. The knowledge that the inorganic film 109 is able to suppress the gradual deterioration of the electron injection layer 110 was obtained through the experiments described below.

(Experimental Device)

Figure 3A:
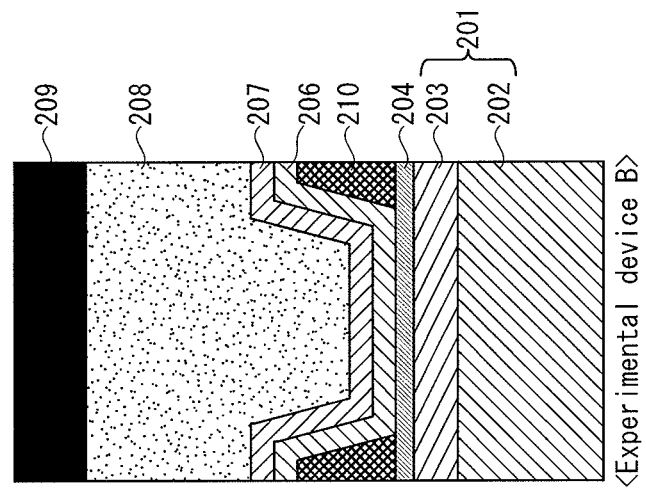
FIGS. 3A and 3B are cross-sectional diagrams of experimental devices A and B.
Figure 3B:
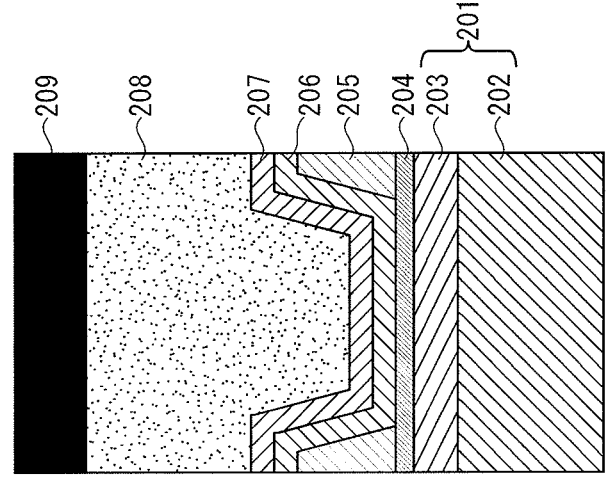

Specifically, experimental devices were constructed as indicated in FIGS. 3A and 3B, and several experiments were conducted thereon.

FIGS. 3A and 3B are partial cross-sectional diagrams respectively illustrating experimental devices A and B. Experimental device A shown in FIG. 3A includes an auxiliary wire 201, a hole injection layer 204, a resin partition layer 205, a electron injection layer 206, a common electrode 207, a sealing layer 208, and a casing 209. The auxiliary wire 201 is formed by layering an ACL (an alloy of aluminium, cobalt, and lanthanum) layer 202 and a IZO layer 203. The ACL layer 202 has a thickness of 200 nm and the IZO layer 203 has a thickness of 16 nm. The hole injection layer 204 is formed of tungsten oxide ($WO_x$, where x is generally a real number satisfying $2<x<3$) and has a thickness of 5 nm. The resin partition layer 205 is made using an acrylic resin and has a thickness of 1 μm. The electron injection layer 206 is made using an organic material having electron injection capabilities and mixed with barium, having a thickness of 35 nm. The barium is present at 10 wt %. The common electrode 207 is made using ITO and has a thickness of 35 nm. The sealing layer 208 is made using SiN and has a thickness of 620 nm.

Experimental device B, shown in FIG. 3B, differs from experimental device A shown in FIG. 3A only in that the resin partition layer 205 is replaced by an inorganic partition layer 210, which is made of SiN. (The resin partition layer 205 and the inorganic partition layer 210 are hereinafter jointly referred to as a partition layer.)

(Experimental Results)

Figure 4:
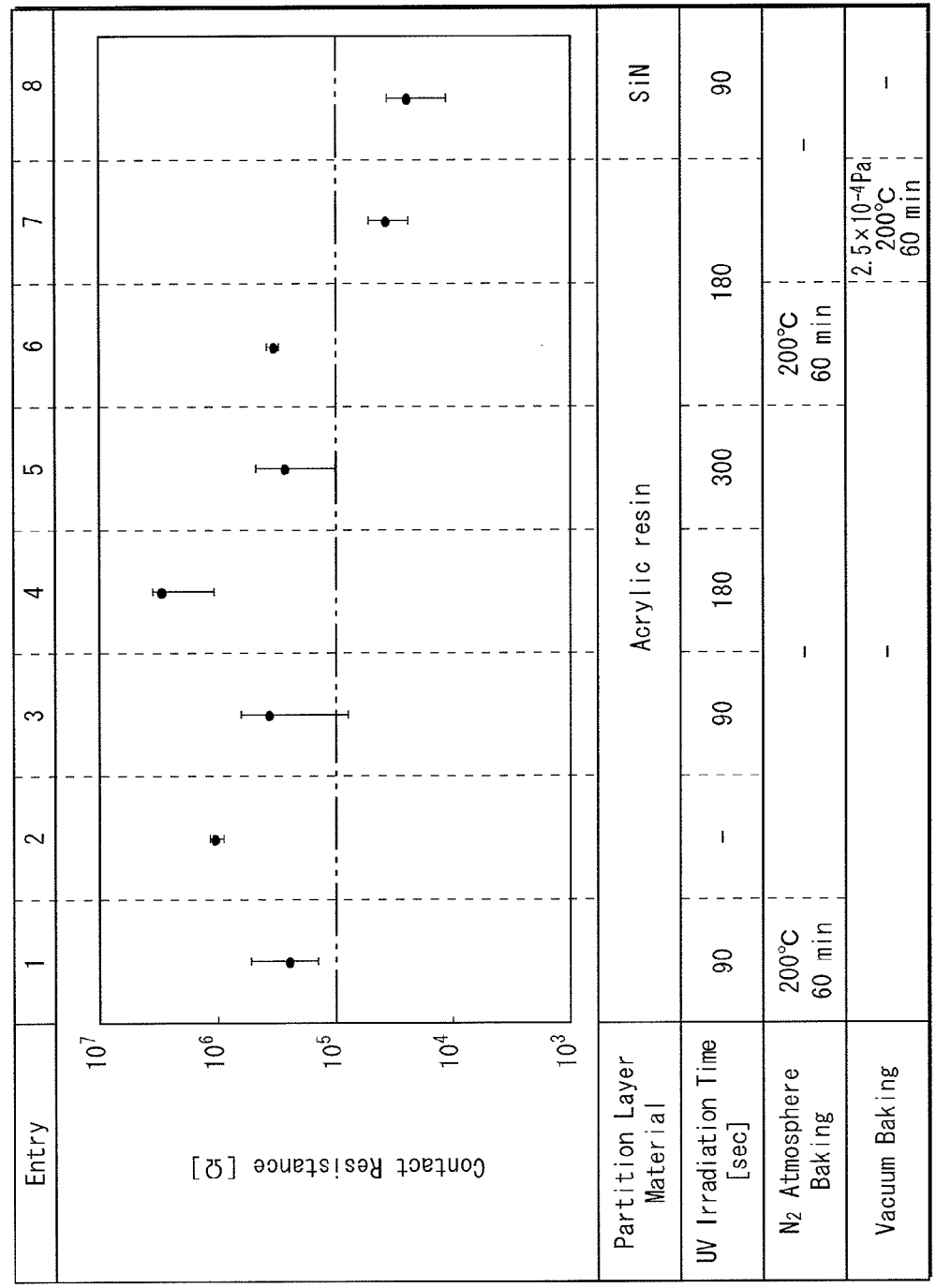
FIG. 4 is a table listing results of measuring the contact resistance between an auxiliary wire 201 and a common electrode 207 in the experimental devices A and B from FIG. 3.

FIG. 4 illustrates the results in the form of measured contact resistance (in ohms) between the auxiliary wire 201 and the common electrode 207 for the experimental devices A and B shown in FIGS. 3A and 3B, in a situation where a predetermined process has been applied to the partition layer prior to electron injection layer 206 formation.

Entries 1 through 7 used experimental device A, while entry 8 used experimental device B. Also, the predetermined process performed on the partition layer is specifically a process of UV irradiation, baking in a nitrous atmosphere, and baking in a vacuum. In FIG. 4, the duration of the UV irradiation process is given in the UV Irradiation Time heading, the temperature and duration of the nitrous atmosphere baking process are given in the $N_2$ Atmosphere Baking heading, and the chamber pressure, temperature, and duration of the vacuum baking process are given in the Vacuum Baking heading. The portions of the UV Irradiation Time, $N_2$ Atmosphere Baking, and Vacuum Baking headings marked with a hyphen (-) indicate that the corresponding process was not performed for the relevant entry.

Then, for each of the experimental devices, the electron injection layer 206, the common electrode 207, the sealing layer 208, and the casing 209 are formed after the above-described processes have been applied to the partition layer. The contact resistance between the auxiliary wire 201 and the common electrode 207 was measured 24 hours later.

For entry 1, the UV irradiation process was applied to the partition layer for 90 seconds, and the nitrous atmosphere baking process was performed. However, these processes are both included in the standard partition layer formation step. That is, the partition layer processed for entry 1 is a partition layer in the default state. The 90-second UV irradiation process is performed in order to remove any insulating organic materials from the resin partition layer. The nitrous atmosphere baking process is performed in order to solidify the resin partition layer (refer to the Manufacturing Method section of the present document for details).

The results of entry 2 indicate a much greater contact resistance than entry 1 when the UV irradiation process and the nitrous atmosphere baking process are not performed. Also, the results of entry 3 indicate that performing the 90-second UV irradiation process without performing the nitrous atmosphere baking process does not substantially change the contact resistance 1 in comparison to entry 1. Furthermore, entries 4 and 5 indicate that extending the duration of the UV irradiation process to 180 seconds or to 300 seconds does not decrease the contact resistance. In fact, in entry 4, the contact resistance is increased by an order of magnitude. In entry 6, the UV irradiation process was performed for 180 seconds and the nitrous atmosphere baking process was performed, resulting in no decrease in contact resistance.

However, as shown by entry 7, performing the vacuum baking process in addition to the 180-second UV irradiation process results in the contact resistance being reduced as low as 100 kΩ (i.e., below the double-chained line in FIG. 4). Further, as shown by entry 8, when the resin partition layer 205 made of an insulating organic material is replaced by an inorganic partition layer 210 made of SiN, then the contact resistance is decreased to 100 kΩ without the nitrous atmosphere baking process and the vacuum baking process.

The only difference between entry 3 and entry 8 is the material used for the partition layer. That is, the contact resistance was decreased by changing the material for the partition layer from an organic material to an inorganic material. Accordingly, the organic material is used for the resin partition layer, is disposed between the auxiliary wire 201 and the common electrode 207, and was determined to influence the layers in contact with the resin partition layer 205, i.e., at least one of the hole injection layer 204 and the electron injection layer 206.

Furthermore, the results of entries 6 and 7 indicate that the contact resistance was decreased by modifying the conditions the baking process from a nitrous atmosphere to a vacuum. Accordingly, the inventors determined that outgassing from the organic material had an effect on at least one of the hole injection layer 204 and the electron injection layer 206. The reason for this is likely that while outgassing is promoted by the heating of the resin partition layer 205, outgassing is even further promoted by the vacuum baking process. Then, after a 60-minute vacuum baking process, all outgassing from the resin partition layer 205 is expelled. Thus, after the vacuum backing process, the influence on the hole injection layer 204 and the electron injection layer 206 is determined to be eliminated.

Next, the materials used for the hole injection layer 204 and the electron injection layer 206 are examined. The material for the hole injection layer 204 is tungsten oxide, which is chemically stable (i.e., is not prone to chemical reactions). No particular limitation to tungsten is intended. The other materials listed above possess similar properties of chemical stability. In contrast, the electron injection layer 206 includes barium, which is chemically active and prone to chemical reactions. Likewise, no particular restriction to barium is intended. Other alkali metals and alkali earth metals typically have similar properties. Here, the alkali metals and alkali earth metals form chemical compounds such as oxides, hydroxides, halides, and so on. These compounds are widely known to have high electrical resistance in comparison to simple metals.

Given the above, the inventors determined that, in a conventional organic EL display panel, the alkali metals or alkali earth metals in the electron injection layer 110 react with water and organic materials in the outgassing occurring in the resin partition layer 107. That is, the electron injection layer 110 undergoes deterioration. Then, as the electron injection layer 110 deteriorates, the electrical resistance thereof increases. This was determined to result in an increase in contact resistance between the auxiliary wire 105 and the common electrode 111. This phenomenon is not limited to situations where the electron injection layer 110 includes alkali metals and alkali earth metals. Similar problems also occur when the material making up the electron injection layer 110 is at least one of oxidable and hygroscopic.

Thus, the inventors arrived at suppressing the deterioration of the electron injection layer 110 due to outgassing by disposing the inorganic film 109 between the electron injection layer 110 and the side walls of the opening for the aperture 113 in the resin partition layer 107 over the auxiliary wire 105, as shown in FIG. 2A.

The above-described experimental results (i.e., comparing entry 3 to entry 8) suggest that the inorganic material has no adverse effects on the electron injection layer 110. Accordingly, the inorganic film 109 disposed between the resin partition layer 107 and the electron injection layer 110 has no adverse effects on the electron injection layer 110, either.

(Manufacturing Method)

EXAMPLE 1

FIGS. 5A, 5B, and 5C through 7A and 7B are cross-sectional diagrams illustrating Example 1 of a manufacturing method for the organic EL display panel 10 pertaining to Embodiment 1.

Figure 5A:
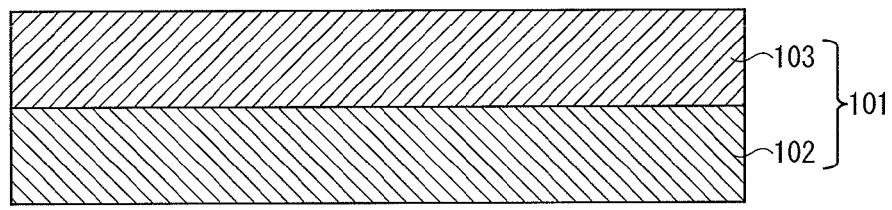
FIGS. 5A, 5B, 5C, and 5D are cross-sectional diagrams illustrating Example 1 of a manufacturing method for the organic electroluminescence display panel 10 pertaining to Embodiment 1.

First, as shown in FIG. 5A, the substrate 101 is prepared by forming the TFT substrate over the inter-layer insulation film 103.

Figure 5B:
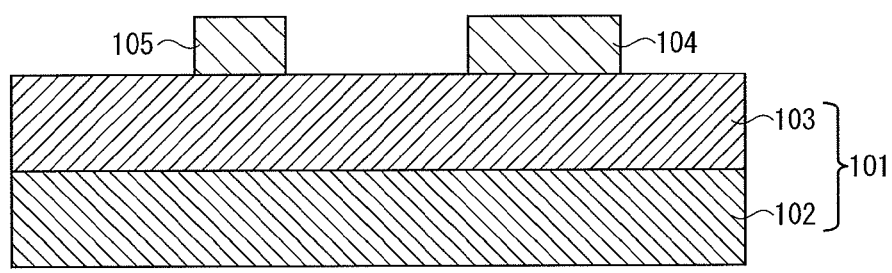

Next, a thin film of conducting material is formed over the inter-layer insulation film 103. This film is formed using a vacuum thin-film coating method, such as vacuum deposition or sputtering. After film formation, patterning is performed using photolithography to form the pixel electrode 104 and the auxiliary wire 105 at a distance therefrom, as shown in FIG. 5B. In the present Embodiment, the pixel electrode 104 and the auxiliary wire 105 are formed of the same material, and thus are formed in a single manufacturing step. Accordingly, there is no need for a step of forming the auxiliary wire 105 separately from the pixel electrode 104. Thus serves to reduce the quantity of manufacturing steps.

Figure 5C:
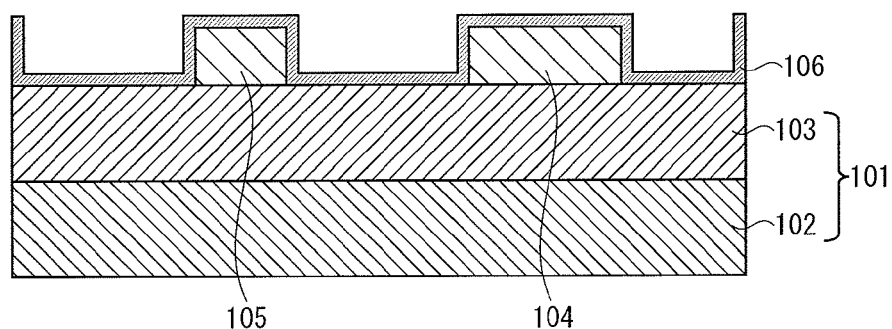

Next, as shown in FIG. 5C, the hole injection layer 106 is formed over the entirety of the substrate 101, the pixel electrode 104, and the auxiliary wire 105. The hole injection layer 106 is, for example, formed using a vacuum thin-film coating method, such as vacuum deposition or sputtering.

Figure 5D:
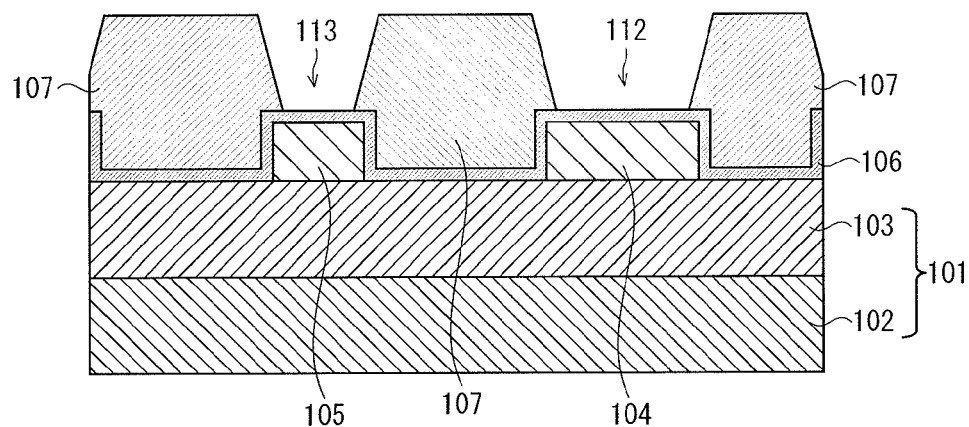

Next, a partition material layer is formed of an insulating organic material, over the hole injection layer 106. The partition material layer is formed, for example, by application or similar. Subsequently, a masque having apertures of predetermined dimensions is overlaid on the partition material layer. Upon exposing the top of the masque to light, excess portions of the partition material layer are washed away with developer fluid. The patterning of the partition material layer is thus complete. Thus, as shown in FIG. 5D, the resin partition layer 107 having the apertures 112 and 113 is formed over the pixel electrode 104 and the auxiliary wire 105. Next, the UV irradiation process is performed on the resin partition layer 107. Once any dross from the insulating organic material remaining on the hole injection layer 106 and exposed through the apertures 112 and 113 has been eliminated, the resin partition layer 107 is baked in the nitrous atmosphere.

Here, the baking of the resin partition layer 107 in the nitrous atmosphere may be replaced with a process of baking in a vacuum. This enables the volume of outgassing occurring in the resin partition layer 107 after baking to be greatly reduced. As a result, the gradual deterioration of the electron injection layer 110 is expected to be successfully constrained.

Figure 6A:
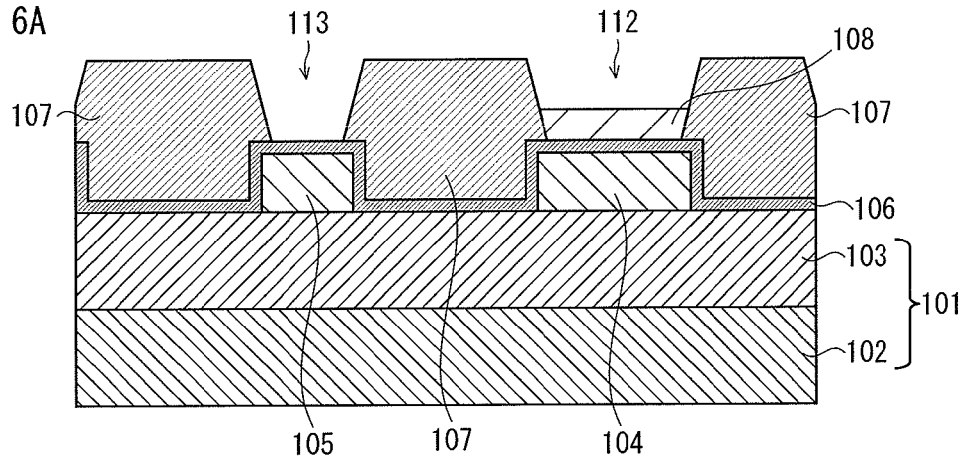
FIGS. 6A, 6B, and 6C are cross-sectional diagrams further illustrating Example 1 of the manufacturing method for the organic electroluminescence display panel 10 pertaining to Embodiment 1.

Next, as shown in FIG. 6A, the organic light-emitting layer 108 is formed in each of the apertures 112 over the pixel electrode 104, using the ink jet method, for example. Specifically, an ink that includes organic material corresponding to one of R, G, and B, as well as a solvent, is dripped into each of the apertures 112, and the ink is dried through solvent evaporation.

Figure 6B:
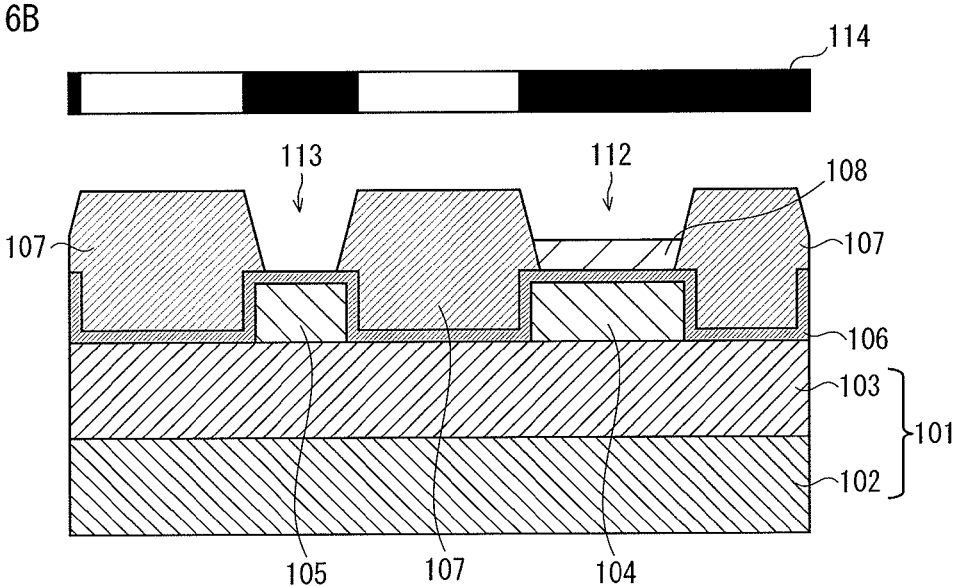

After formation, a masque 114, provided with openings in portions corresponding to the predicted regions of formation for the inorganic film 109 (see FIG. 2A) is overlaid on the organic light-emitting layer 108, and the inorganic material forming the inorganic film 109 is vapour-deposited onto the masque 114 (see FIG. 6B). As a result, the inorganic film 109 is formed over the top face of the resin partition layer 107 in portions corresponding to the side walls of the openings for the aperture 113 in the resin partition layer 107 and to the apertures 112 and 113.

Here, the resin partition layer 107 is formed with a third purpose in addition to the first and second purposes given above, namely to prevent the mixing of inks containing organic materials corresponding to different colours during organic light-emitting layer 108 formation (see FIG. 6A). For example, the resin partition layer 107 serves to prevent ink that includes the R organic material from spilling out of aperture 112R (see FIG. 2B) into neighbouring aperture 112G. Thus, during the organic light-emitting layer 108 formations step, the top face of the resin partition layer 107 corresponding to areas between apertures 112 beneficially has water-repellent properties.

Figure 6C:
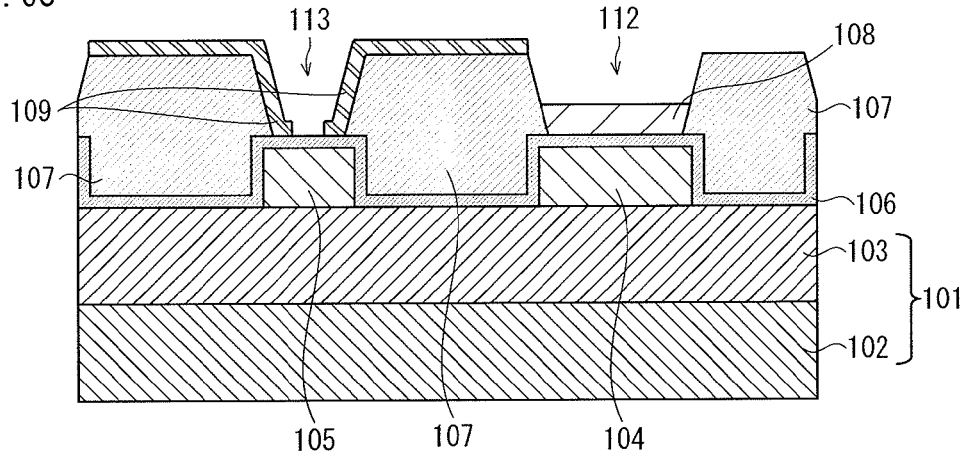

Then, in the present manufacturing method, the inorganic film 109 is formed after the organic light-emitting layer 108 formation, as shown in FIGS. 6A through 6C. That is, the organic light-emitting layer 108 is formed in the step that follows the formation of the resin partition layer 107. Accordingly, the water-repellent properties are not impeded during organic light-emitting layer 108 in contrast to a situation where the inorganic film 109 is formed immediately after the formation of the resin partition layer 107.

Next, the electron injection layer 110 is formed so as to cover the resin partition layer 107, the organic light-emitting layer 108, and the inorganic film 109, using a vacuum thin-film coating method, such as vacuum deposition or sputtering, for example. At this point, the electron injection layer 110 is formed so as to be in contact with the hole injection layer 106 within the aperture 113 above the auxiliary wire 105 (see FIG. 7A).

Figure 7A:
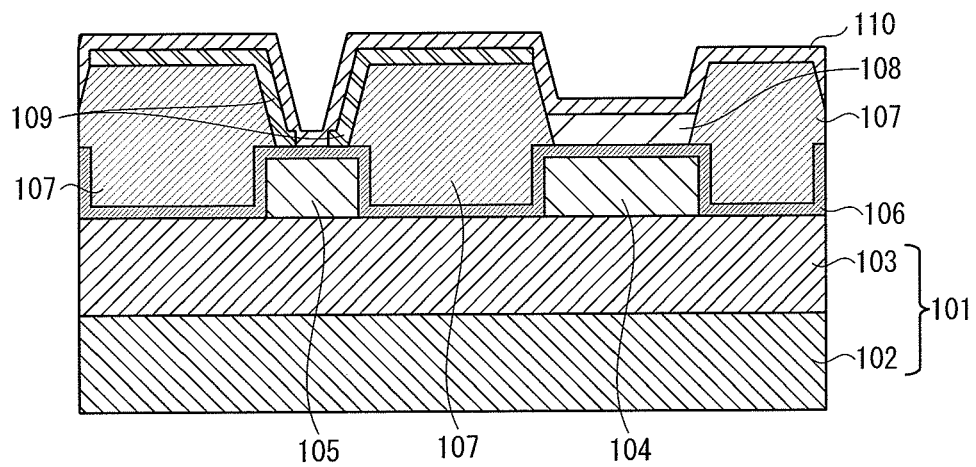
FIGS. 7A and 7B are cross-sectional diagrams further illustrating Example 1 of the manufacturing method for the organic electroluminescence display panel 10 pertaining to Embodiment 1.
Figure 7B:
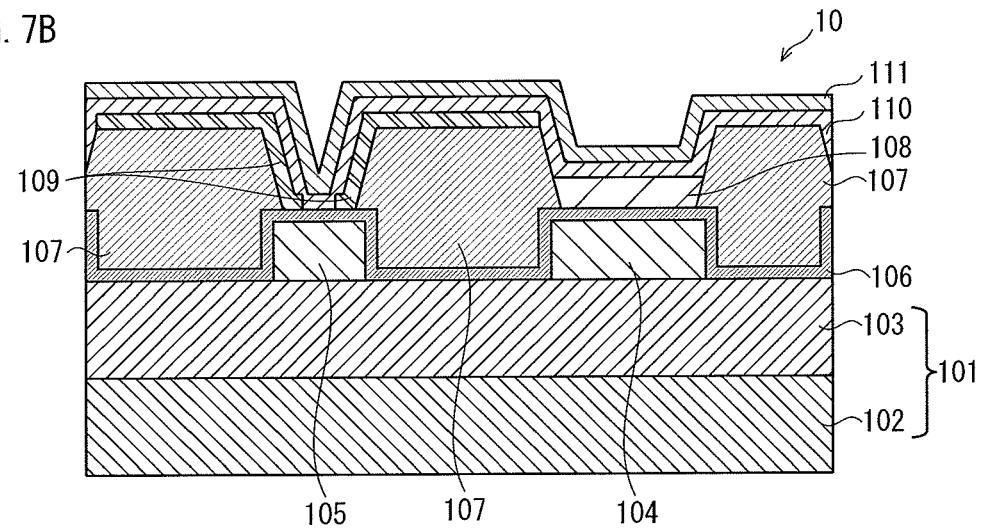

Then, the common electrode 111 is formed so as to cover the top face of the electron injection layer 110, using a vacuum thin-film coating method, such as vacuum deposition or sputtering, for example (see FIG. 7B). The organic EL display panel 10 is completed through the above steps.

EXAMPLE 2

FIGS. 8A, 8B, 9A and 9B are cross-sectional diagrams illustrating Example 2 of a manufacturing method for the organic EL display panel 10 pertaining to Embodiment 1. The point of difference from FIGS. 5A, 5B, 5C, and 5D through 7A and 7B is the formation method for the inorganic film 109.

Figure 8A:
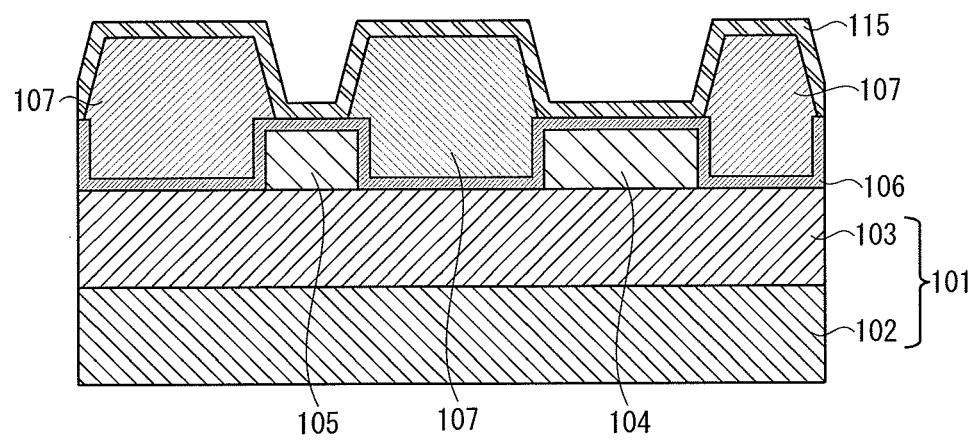
FIGS. 8A and 8B are cross-sectional diagrams illustrating Example 2 of the manufacturing method for the organic electroluminescence display panel 10 pertaining to Embodiment 1.

The steps are identical to those of Example 1 (FIGS. 5A, 5B, 5C, and 5D) until the resin partition layer 107 formation step. After the formation of the resin partition layer 107, a layer 115 of inorganic material for forming the inorganic film 109 is formed over the entirety of the substrate 101, as shown in FIG. 8A.

Figure 8B:
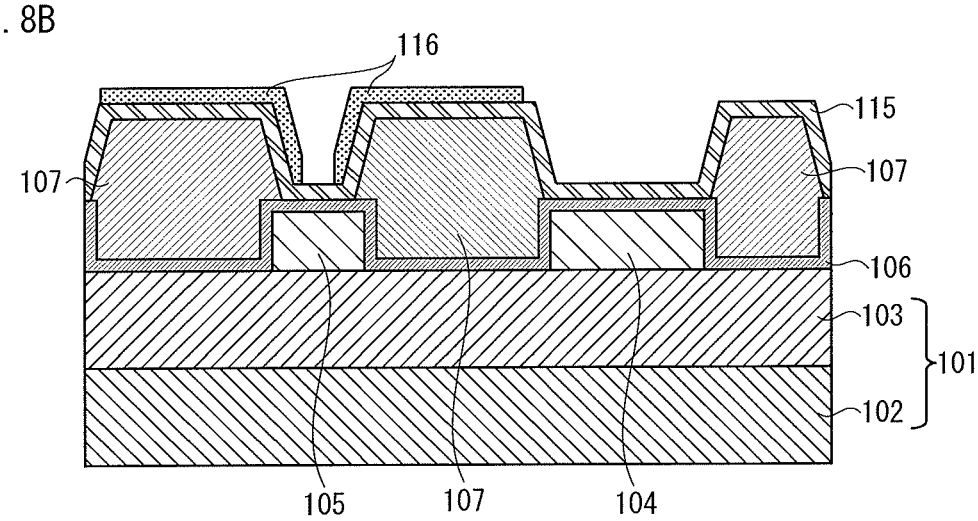

Next, as shown in FIG. 8B, a photosensitive resist 116 is applied to the predicted regions of formation for the inorganic film 109 and subsequently exposed to light. In the present manufacturing method, the resist 116 is a negative photoresist. Then, portions of the layer 115 of inorganic material not exposed to the light (i.e., portions where the resist 116 is not formed) are washed away with developer fluid. Thus, these portions are eliminated, with the exception of the predicted regions of formation for the inorganic film 109. Accordingly, the inorganic film 109 is patterned (see FIG. 9A).

Figure 9A:
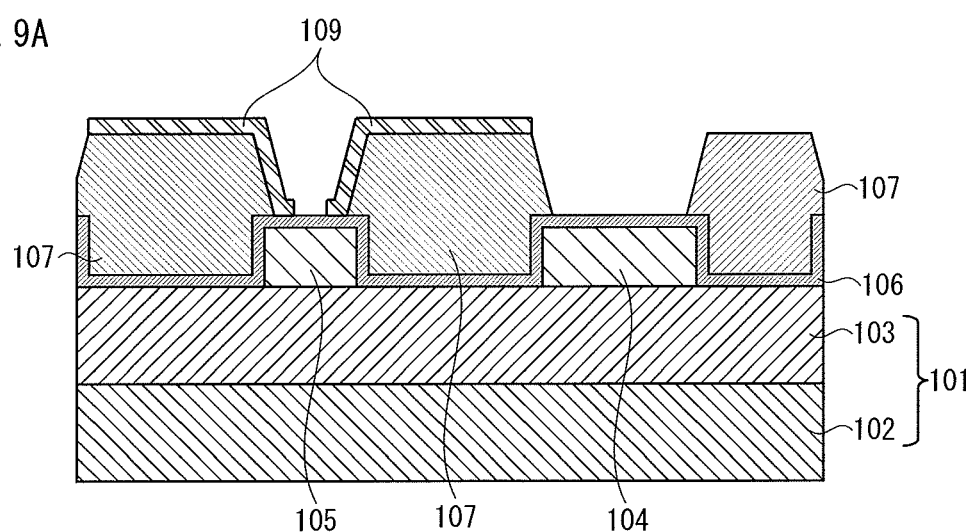
FIGS. 9A and 9B are cross-sectional diagrams further illustrating Example 2 of the manufacturing method for the organic electroluminescence display panel 10 pertaining to Embodiment 1.
Figure 9B:
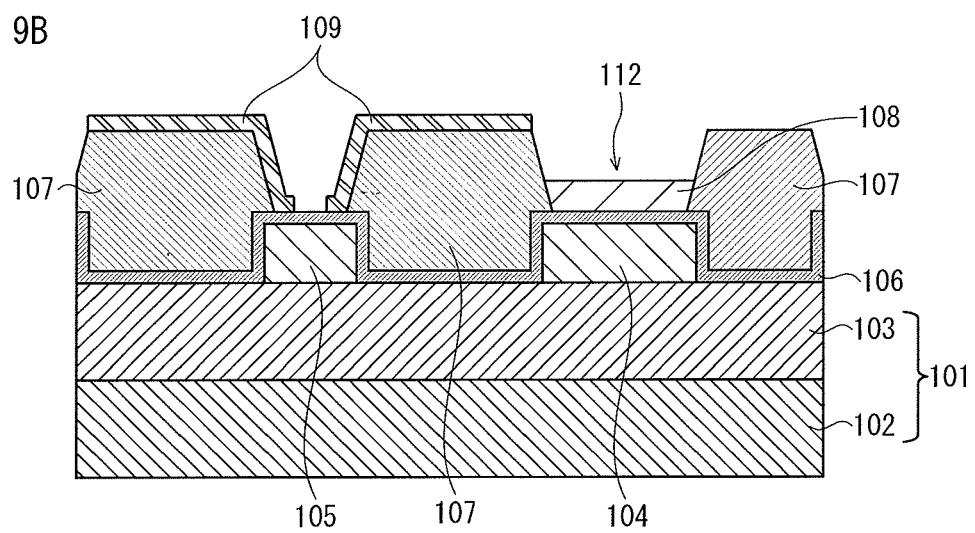

Subsequently, the organic light-emitting layer 108 is formed in the apertures 112 over the pixel electrode 104 in accordance with the method described with reference to FIG. 6A (see FIG. 9B). The remainder of the manufacturing method is identical to Example 1.

(Embodiment 2)

When the material used for the inorganic film is more oxidable or hygroscopic than the material used for the electron injection layer, then the deterioration of the electron injection layer caused by outgassing from the resin partition layer is more effectively constrained in comparison to Embodiment 1.

(Configuration)

The organic EL display panel pertaining to the present Embodiment is configured identically to that shown in FIG. 2. Among the materials for the inorganic film 109 listed in Embodiment 1, materials that are more oxidable or hygroscopic than the material for the electron injection layer 110 include aluminium (Al), silver (Ag), copper (Cu), and magnesium (Mg). That is, these materials are more prone to reacting with oxygen or with water, relative to the material used for the electron injection layer 110. Using a material for the inorganic film 109 that is more oxidable or hygroscopic than the material for the electron injection layer 110 leads to the inorganic film 109 reacting with the alkali metals or alkali earth metals included in any outgassing from the electron injection layer 110 before any reactions occur in the resin partition layer 107.

Accordingly, using a material for the inorganic film 109 that is more oxidable or hygroscopic than the material for the electron injection layer 110 not only physically separates (i.e., eliminates contact between) the electron injection layer 110 from the resin partition layer 107, but also leads to the outgassing occurring in the resin partition layer 107 adhering to the inorganic film 109. Thus, the electron injection layer 110 is more reliably protected from the outgassing.

In order to achieve the effect of having the outgassing adhere to the inorganic film 109, the inorganic film 109 beneficially has a thickness of 3 nm or greater. This enables the formation of a inorganic film 109 that is continuous and free of pinholes. In the event that pinholes do form, the outgassing may reach the electron injection layer 110 by leaking through the pinholes.

In order to achieve the above-described effect, the inorganic film 109 is beneficially more oxidable and hygroscopic than the material used for the electron injection layer 110. However, no limitation to the above-listed metals is intended. Also, the inorganic film 109 may be either a conductor or an insulator.

Further, the material used for the inorganic film 109 need not necessarily be more oxidable as well as more hygroscopic than the material used for the electron injection layer 110. When the material used for the electron injection layer 110 is oxidable, then a material that is more highly oxidable than the material for the electron injection layer 110 is beneficial. Likewise, when the material used for the electron injection layer 110 is hygroscopic, then a material that is more hygroscopic than the material for the electron injection layer 110 is beneficial.

The manufacturing method for the organic EL display panel pertaining to the present Embodiment is identical to those described in Embodiment 1, and is thus omitted.

(Experiments and Discussion)

(Experimental Device)

Experimental devices were constructed as indicated in FIGS. 10A, 10B and 10C, and several experiments were conducted thereon.

FIGS. 10A, 10B, and 10C are cross-sectional diagrams of experimental devices C, D, and E. Layers having the same reference numbers as experimental devices A and B described in FIGS. 3A and 3B are omitted from the following explanation.

Experimental device C shown in FIG. 10A includes an auxiliary wire 201, a hole injection layer 204, a resin partition layer 205, a electron injection layer 211, a common electrode 212, a sealing layer 208, and a casing 209. The electron injection layer 211 is a layer of barium having a thickness of 5 nm. The common electrode 212 is a layer of aluminium having a thickness of 120 nm.

Experimental device D shown in FIG. 10B differs from experimental device C of FIG. 10A in having an inorganic film 213 disposed between the resin partition layer 205 and the electron injection layer 211. The inorganic film 213 is a layer of aluminium having a thickness of 200 nm.

Likewise, experimental device E shown in FIG. 10C differs from experimental device A of FIG. 3A in having an inorganic film 213 disposed between the resin partition layer 205 and the electron injection layer 206. As in the experimental device D, the inorganic film 213 is a layer of aluminium having a thickness of 200 nm.

(Experimental Results)

Figure 11:
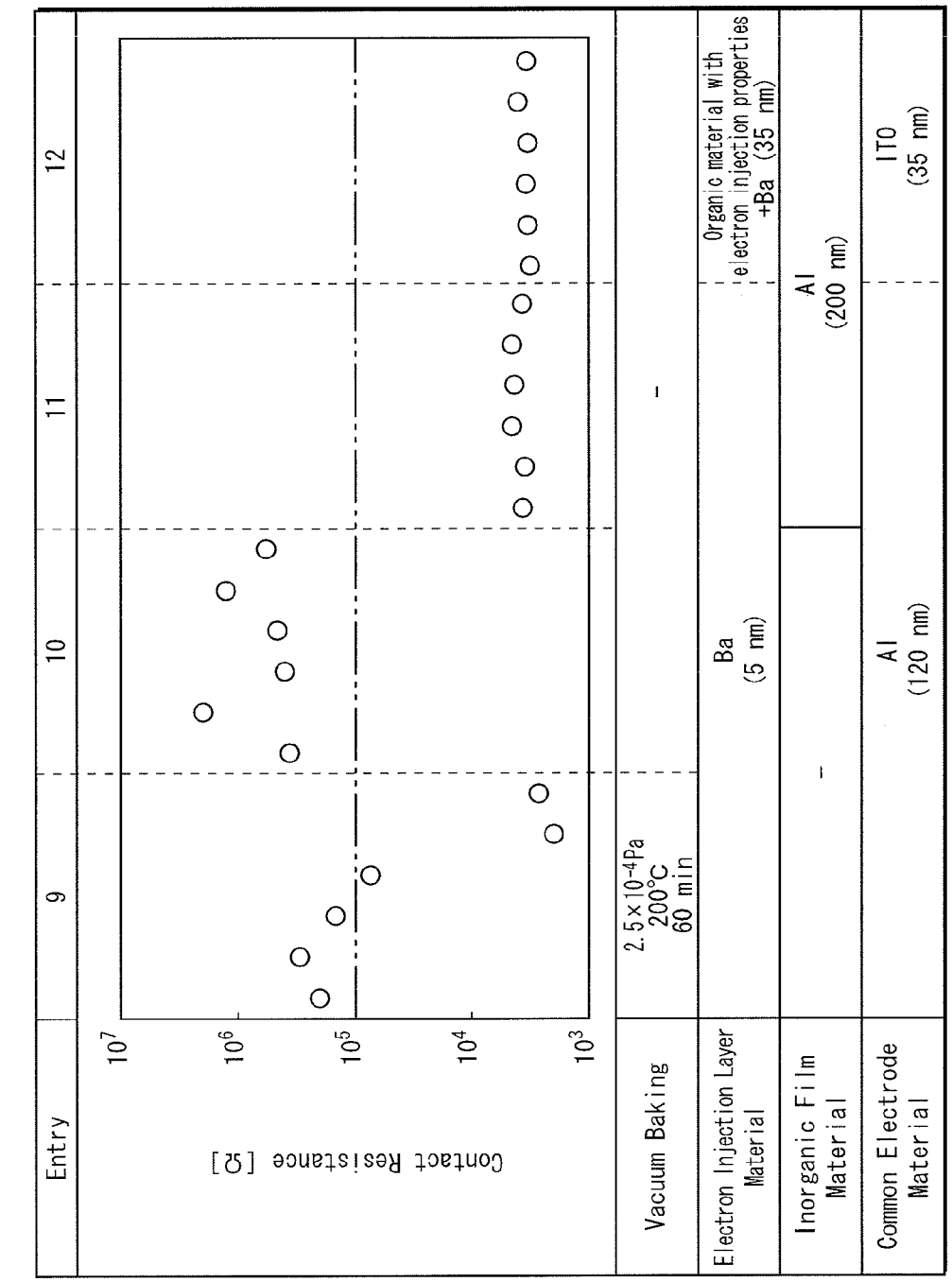
FIG. 11 is a table listing results of measuring the contact resistance between an auxiliary wire 201 and a common electrode 212 in experimental devices C and D, as well as the contact resistance between the auxiliary wire 201 and the common electrode 207 in experimental device E.

FIG. 11 presents a table indicating the results of measuring the contact resistance between the auxiliary wire 201 and the common electrode 212 in experimental devices C and D, as well as the contact resistance between the auxiliary wire 201 and the common electrode 207 in experimental device E.

Entries 9 and 10 used experimental device C, while entry 11 used experimental device B, and entry 12 used experimental device E. In the table of FIG. 11, the Vacuum Baking heading indicates whether or not the vacuum baking process was performed. The conditions for the vacuum baking process are as described above with reference to FIG. 4. The Electron Injection Layer Material, Inorganic Film Material, and Common Electrode Material headings each give the material used for the corresponding component, along with the thickness thereof. Given that experimental device C does not include the inorganic film 213, the Inorganic Film Material headings for entries 9 and 10 are marked with hyphens.

Then, 24 hours after the experimental devices have been formed, the contact resistance is measured (in ohms) between the auxiliary wire 201 and the common electrode 212 (for experimental devices C and D) or between the auxiliary wire 201 and the common electrode 207 (for experimental device E).

The difference between entry 10 and entry 11 is the presence of the inorganic film 213. The presence of the inorganic film 213 between the resin partition layer 205 and the electron injection layer 211 was found to decrease the contact resistance to 100 kΩ or lower. In entry 10, the layer of aluminium serving as the common electrode 212 is formed over the electron injection layer 211. Thus, the contact resistance exceeds 100 kΩ. Accordingly, forming the inorganic film 213 between the resin partition layer 205 and the electron injection layer 211 effectively lowers the contact resistance. Here, the contact resistance values given for each entry in FIG. 11 represent the contact resistance as measured at six points within a single experimental device. Also, in comparison to entry 10, entry 11 demonstrably suppressed the variability in contact resistance that occurs within the experimental device.

The difference between entry 12 (experimental device E) and entries 1 through 7 of FIG. 4 (also experimental device A in FIG. 3A) is the presence of the inorganic film 213. Disposing the inorganic film 213 between the resin partition layer 205 and the electron injection layer 206 was found to decrease the contact resistance to 100 kW or lower similarly to entry 11, and also to suppress the variability in contact resistance.

The difference between entry 11 and entry 12 is the materials used for the electron injection layer and the common electrode Comparing entry 11 and entry 12 reveals that, when the inorganic film 213 is disposed between the resin partition layer 205 and the electron injection layer 206, the contact resistance is effectively decreased regardless of the electron injection layer thickness, the presence of an organic material having electron injection capabilities, or of the material used for the common electrode.

Furthermore, the difference between entry 9 and entry 10 is the vacuum baking process. Comparing the two entries reveals that, much like entry 6 and entry 7 in Embodiment 1, performing the vacuum baking process serves to reduce the contact resistance. However, the vacuum baking process was not performed for entries 11 and 12, yet the presence of the inorganic film 213 between the resin partition layer 205 and the electron injection layer 206 was found to reduce the contact resistance even lower than entries in which the vacuum baking process was performed. Accordingly, when the inorganic film 213 is disposed between the resin partition layer 205 and the electron injection layer 206 the contact resistance is sufficiently decreased despite the vacuum baking process not being performed.

According to the above explanations, using a material for the inorganic film that is an excellent sealant and is more oxidable or hygroscopic than the material used for the electron injection layer enables the influence of outgassing on the electron injection layer to be effectively diminished. As a result, the gradual deterioration of the electron injection layer is more effectively constrained.

(Embodiment 3)

When a conducting material is used as the material used for the inorganic film, improvements to the electrical properties of the common electrode and the auxiliary wire are possible at the aperture over the auxiliary wire.

(Configuration)

Figure 12:
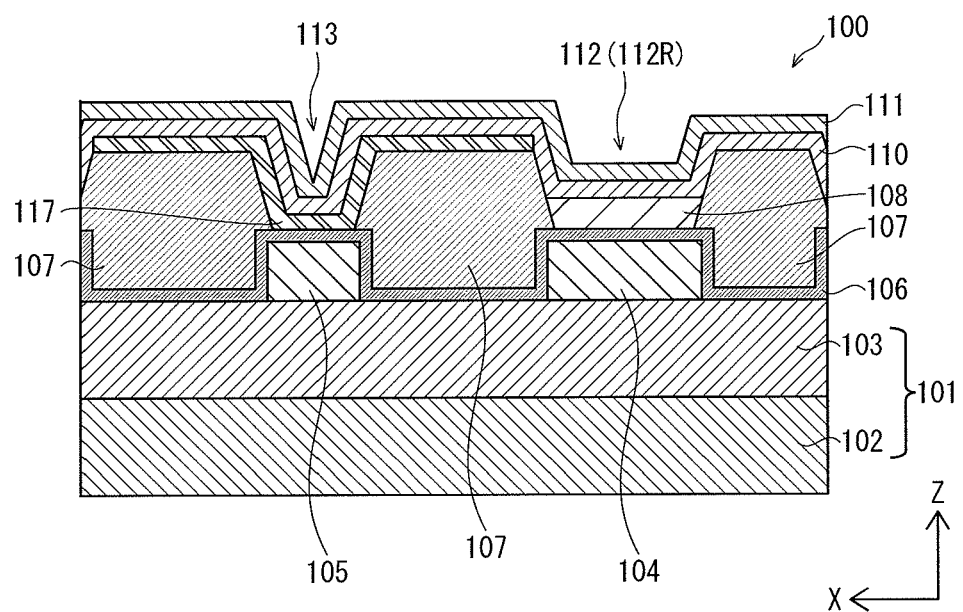
FIG. 12 is a partial cross-section illustrating the configuration of an organic EL display panel 100 pertaining to Embodiment 3.

FIG. 12 is a partial cross-section illustrating the configuration of an organic EL display panel 100 pertaining to Embodiment 3. In FIG. 12, components identical to those of Embodiments 1 and 2 use the same reference signs thereas, and explanations are thus omitted.

The organic EL display panel 100 differs from the organic EL display panel 10 of FIG. 2A in the configuration of the inorganic film 117. The inorganic film 109 of Embodiment 1 could be either conducting or non-conducting. In contrast, the inorganic film 117 of the present Embodiment is composed of a conducting material. Among the materials for the inorganic film listed in Embodiment 1, aluminium, silver, copper, magnesium, ITO, and IZO are conducting.

As shown in FIG. 12, the inorganic film 117 of the present Embodiment is disposed between the electron injection layer 110 and the side walls of the opening for the aperture 113 n the resin partition layer 107 over the auxiliary wire 105. Also, the inorganic film 117 extends along the top face of the resin partition layer 107 from the side walls of the aperture 113 in the resin partition layer 107 over the auxiliary wire 105. This is similar to FIG. 2A. Furthermore, in the present Embodiment, the inorganic film 117 also extends over the surface of the hole injection layer 106 from the side walls of the aperture 113 in the resin partition layer 107 over the auxiliary wire 105 so as to cover the portion of the hole injection layer 106 exposed through the aperture 113.

As described in Embodiment 1, when the inorganic film 117 is formed from a conducting material, there is no need for the inorganic film 117 to be parted over the hole injection layer 106. In other words, there is no need for the electron injection layer 110 and the hole injection layer 106 to be directly connected. In fact, in the present Embodiment, the inorganic film 117 is disposed between the two layers.

When the inorganic film 117 is made from a conducting material, no particular limitation is intended regarding the thickness of the inorganic film 117 provided that the thickness is sufficient to intercept the outgassing from the resin partition layer 107 and does not become an effective barrier to organic EL display panel manufacture. For example, a thickness of 10 nm to 200 nm is beneficial. Given a thickness on the order of 200 nm for the inorganic film 117, the following effects are expected.

When the inorganic film is formed from a non-conducting material, then the electrical connection between the common electrode 111 and the auxiliary wire 105 occurs in a space between parts of the inorganic film that are both formed in the aperture 113. However, when the inorganic film 117 is formed of a conducting material, as is the case in the present Embodiment, the inorganic film 117 formed over the resin partition layer 107 in the vicinity of the aperture 113 over the auxiliary wire 105 is at the same electric potential as the auxiliary wire 105. Thus, when the inorganic film 117 is formed of conducting material, the electrical connection surface area between the common electrode 111 and the auxiliary wire 105 is effectively expanded relative to situations where the inorganic film 117 is non-conducting.

Effectively expanding the electrical connection surface area between the common electrode 111 and the auxiliary wire 105 does not cause a problematic decrease in voltage at the centre region of the organic EL display panel, despite the material for the common electrode 111 having relatively high electrical resistance in comparison to situations where a non-conducting material is used for the inorganic film. Thus, when the organic EL display panel 100 is a top-emission panel as in the present Embodiment, a material may be selected for the common electrode 111 that has relatively high electrical resistance and high transparency. That is, a degree of freedom is gained for the material selection for the common electrode 111, particularly enabling selection for optical properties.

As described above, the present Embodiment enables improvements to the electrical connectivity between the auxiliary wire and the common electrode in addition to the result of intercepting any outgassing from the resin partition layer.

Also, as described in Embodiment 2, the material used for the inorganic film may be not only conducting, but also more oxidable and hygroscopic than the material used for the electron injection layer. This has the effect of causing the inorganic film to absorb any outgassing from the resin partition layer, in addition to the effects described in the present Embodiment. Among the materials listed in Embodiment 1, those that are conducting in addition to being more oxidable and hygroscopic than the material used for the electron injection layer include, for example, aluminium, silver, copper, magnesium, and so on.

(Manufacturing Method)

Figure 13A:
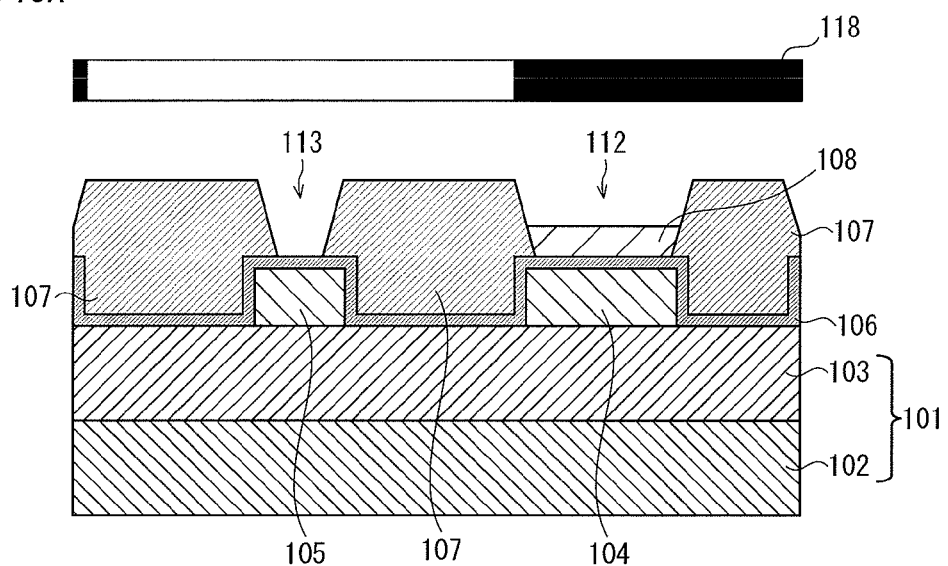
FIGS. 13A and 13B are cross-sectional diagrams further illustrating Example 1 of the manufacturing method for the organic electroluminescence display panel 100 pertaining to Embodiment 3.
Figure 13B:
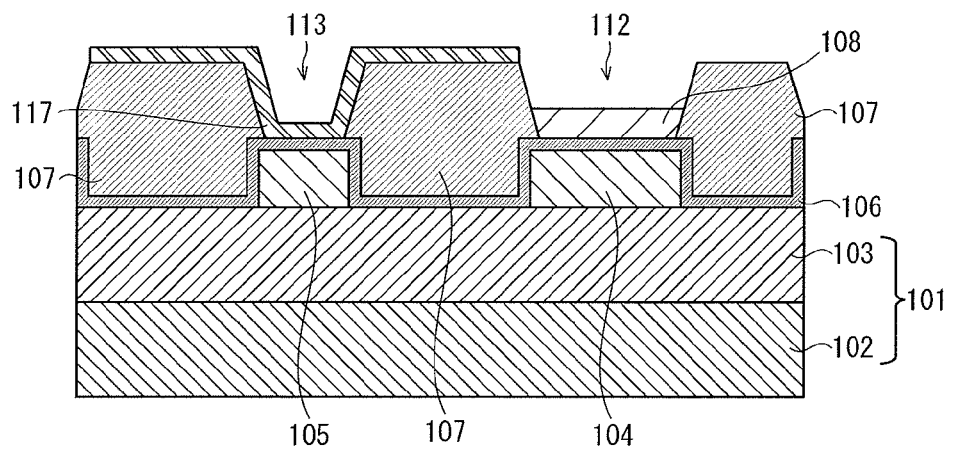

FIGS. 13A and 13B are cross-sectional diagrams illustrating Example 1 of a manufacturing method for the organic EL display panel 100 pertaining to Embodiment 3.

The formation process is identical to that shown in FIGS. 5A-5D and 6A-6C until the formation of the organic light-emitting layer 108. As shown in FIG. 13A, a masque 118 is overlaid having openings in portions corresponding to the predicted regions of formation for the inorganic film 117 (see FIG. 12). Then, the inorganic material for the inorganic film 117 is deposited over the masque 118. As a result, the inorganic film 117 is formed over the side walls of the openings for the aperture 113 in the resin partition layer 107, the top face of the hole injection layer 106 exposed through the aperture 113, and portions of the top face of the resin partition layer 107 corresponding to the area between the apertures 112 and 113 (see FIG. 13B). Afterward, the electron injection layer 110 and the common electrode 111 are formed as described with reference to FIGS. 7A and 7B.

Figure 14A:
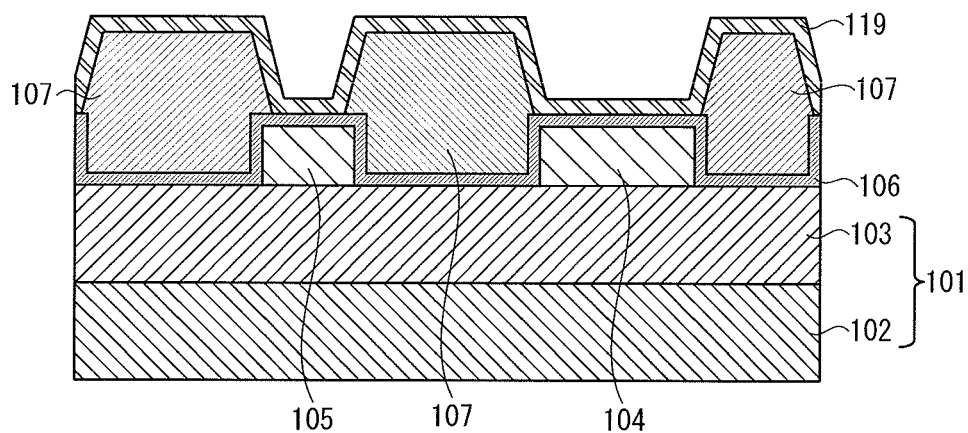
FIGS. 14A, 14B and 14C are cross-sectional diagrams illustrating Example 2 of the manufacturing method for the organic electroluminescence display panel 100 pertaining to Embodiment 3.
Figure 14B:
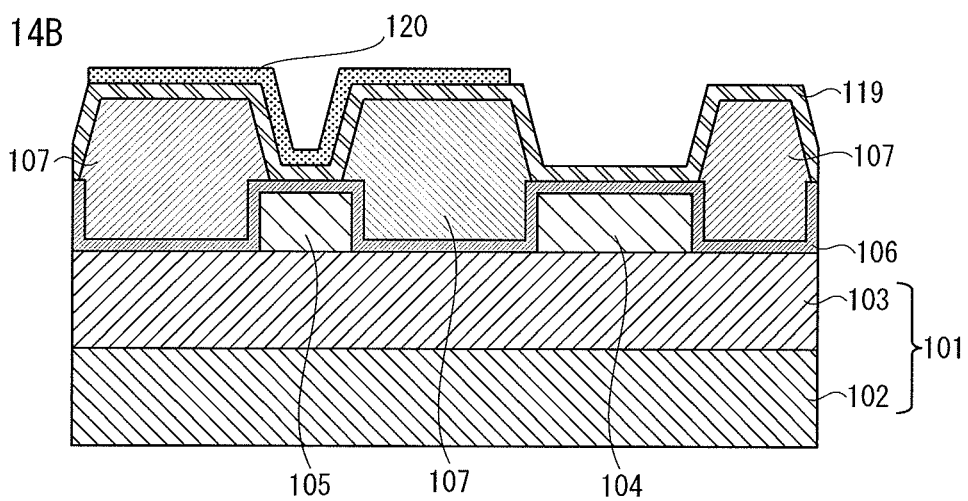
Figure 14C:
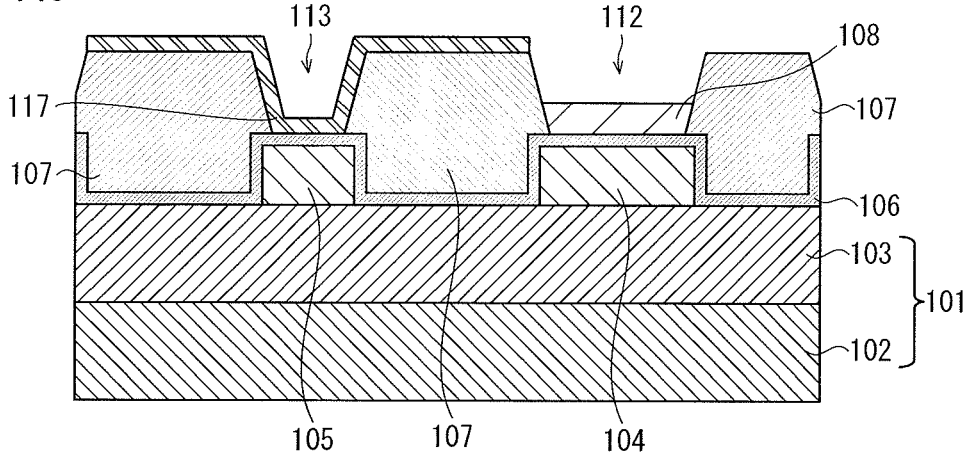

FIGS. 14A, 14B, and 14C are cross-sectional diagrams illustrating Example 2 of a manufacturing method for the organic EL display panel 100 pertaining to Embodiment 3. The point of difference from FIGS. 13A and 13B from Example 1 is the formation method for the inorganic film 117.

The steps are identical to those of FIGS. 5A, 5B, and 5C until the resin partition layer 107 formation step. As shown in FIG. 4A, a layer 119 of inorganic material for forming the inorganic film 117 is formed over the entirety of the substrate 101. Next, as shown in FIG. 14B, a photosensitive resist 120 is applied to the predicted regions of formation for the inorganic film 117 and subsequently exposed to light. Then, portions of the layer 119 of inorganic material not exposed to the light are washed away with developer fluid. Thus, these portions are eliminated, with the exception of the predicted regions of formation for the inorganic film 117. Accordingly, the inorganic film 117 is patterned as shown in FIG. 14C. Then, the organic light-emitting layer 108, the electron injection layer 110, and the common electrode 111 are formed according to the method described in Embodiment 1, and the organic EL display panel 100 is thus completed.

(Variations and Other Remarks)

In the above-described Embodiments, the present disclosure is described by means of example. However, no limitation is intended. For example, the following variations are also possible.

(1) In Embodiment 1, described above, the inorganic film 109 is formed over the side walls of the openings for the aperture 113, portions of the top face of the resin partition layer 107 corresponding to the area between the apertures 112 and 113, and over the hole injection layer 106 above the auxiliary wire 105 (see FIG. 2A). However, no limitation is intended.

Figure 15A:
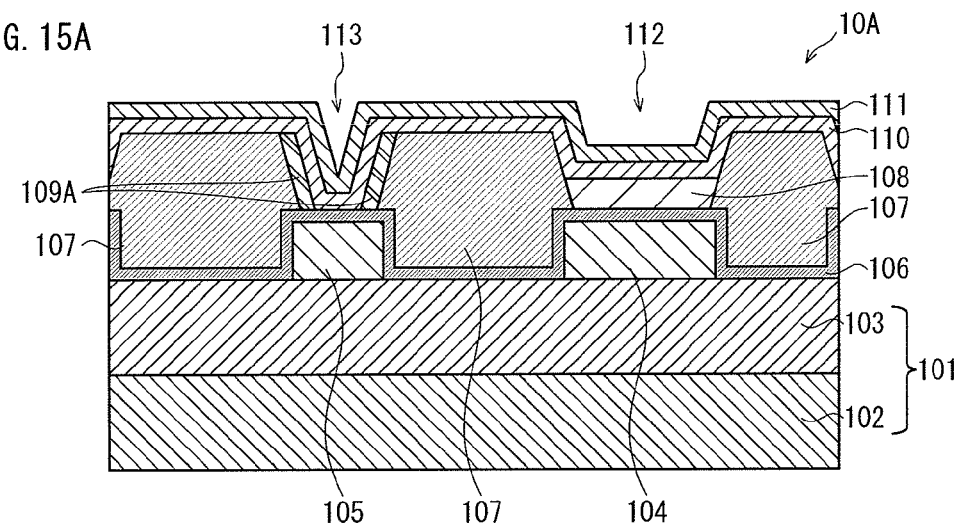
FIGS. 15A, 15B and 15C are partial cross-sections illustrating the configuration of an organic EL display panel pertaining to a variation of Embodiment 1.
Figure 15B:
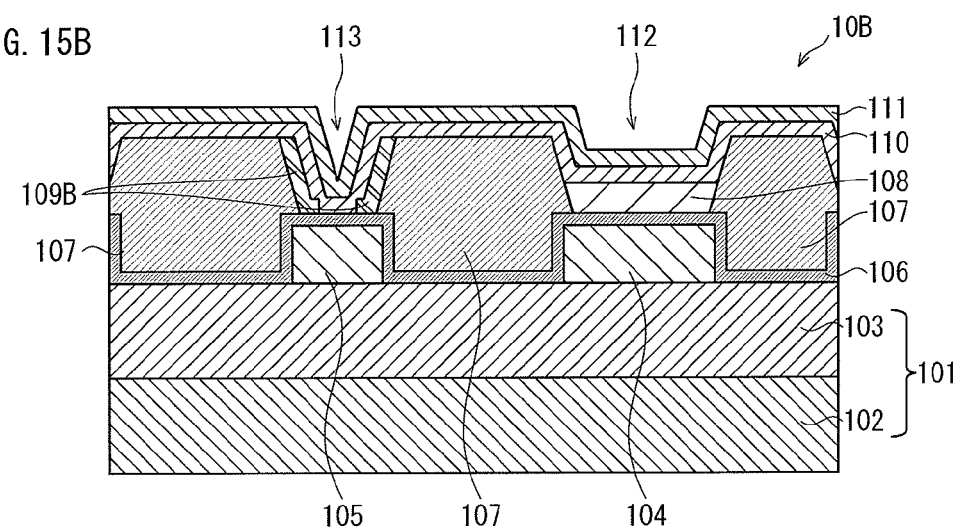
Figure 15C:
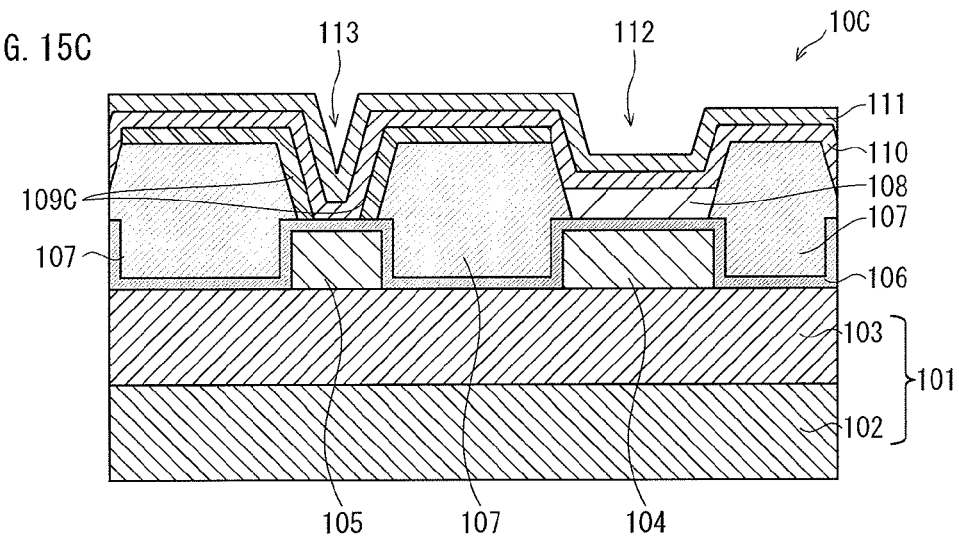
Figure 17:
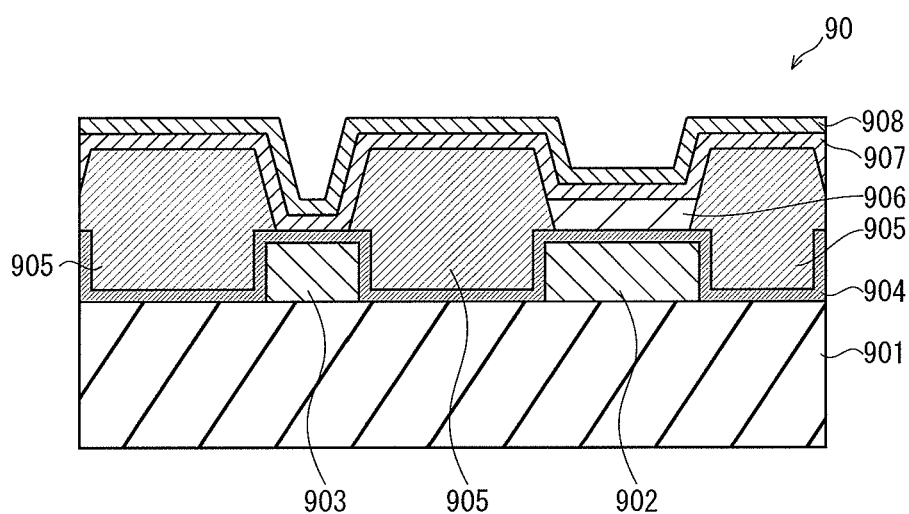
FIG. 17 is a partial cross-sectional diagram illustrating a sample configuration of an organic EL display panel 90 having wiring.

FIGS. 15A, 15B, and 15C are partial cross-sections illustrating the configuration of an organic EL display panel pertaining to a variant of Embodiment 1. As shown in FIG. 15A, an organic EL display panel 10A may have the inorganic film 109A formed solely over the side walls of the opening for the aperture 113. Also, as shown in FIG. 15B, an organic EL display panel 10B may have the inorganic film 109B formed over the side walls of the opening for the aperture 113 and over the top of the hole injection layer 106 above the auxiliary wire 105. Further, as shown in FIG. 15C, an organic EL display panel 10C may have the inorganic film 109C formed over the side walls of the opening for the aperture 113, and over the top face of portions of the resin partition layer 107 between the apertures 112 and 113.

At minimum, when the deterioration of the electron injection layer 110 is constrained in the region where the aperture 113 is formed, this region serving as the main connection area for the auxiliary wire 105 and the common electrode 111, then the gradual increase in contact resistance between the auxiliary wire 105 and the common electrode 111 is also constrained. Thus, a configuration such as that of organic EL display panel 10A, 10B, or 10C also serves to constrain the gradual increase in contact resistance between the auxiliary wire 105 and the common electrode 111.

(2) In Embodiment 3, described above, the inorganic film 117 is formed over the side walls of the openings for the aperture 113 in the resin partition layer 107, and portions of the top face of the resin partition layer 107 corresponding to the area between the apertures 112 and 113. Furthermore, although the inorganic film 117 is described as being formed so as to cover the portions of the hole injection layer 106 exposed through the aperture 113 (see FIG. 12), no limitation is intended.

FIGS. 16A, 16B, 16C, and 16D are partial cross-sections illustrating the configuration of an organic EL display panel pertaining to a variant of Embodiment 3. As shown in FIG. 16A, an organic EL display panel 100A may have the inorganic film 117A formed solely over the side walls of the opening for the aperture 113. Also, as shown in FIG. 16B, an organic EL display panel 100B may have an inorganic film 117B that does not completely cover the portion of the hole injection layer 106 exposed through the aperture 113. That is, the inorganic film 117B may be parted over the hole injection layer 106.

Furthermore, as shown in FIG. 16C, an organic EL display panel 100C may have the inorganic film 117C formed so as to cover the side walls of the opening for the aperture 113 and the portion of the hole injection layer 106 exposed through the aperture 113. Additionally, as shown in FIG. 16D, an organic EL display panel 100D may have the inorganic film 117D formed over the side walls of the opening for the aperture 113, and over the top face of portions of the resin partition layer 107 between the apertures 112 and 113.

At minimum, and much like Variation (1), when the deterioration of the electron injection layer 110 is constrained in the region where the aperture 113 is formed, then the gradual increase in contact resistance between the auxiliary wire 105 and the common electrode 111 is also constrained.

(3) In the above-described Embodiments, the inorganic film formed of an inorganic material is given as an example of a partition film separating the resin partition layer from the electron injection layer in the connection region for the auxiliary wire and the common electrode. However, no limitation is intended. The partition film need not necessarily be an inorganic film as described in the Embodiments, provided that the partition film has excellent sealing properties, does not cause outgassing, and is formed from a material that is not likely to cause deterioration in the electron injection layer.

(4) In the above-described Embodiments, as shown in FIG. 2B, the auxiliary wire 105 is arranged such that one piece of wire is disposed in every pixel (i.e., in every three sub-pixels R, G, and B), and extends in the Y dimension. However, no limitation is intended. For example, the wire may extend in the Y dimension in each sub-pixel, may extend in the X dimension in each pixel, or may extend in the X dimension in each sub-pixel. Furthermore, the wire may be formed as a lattice in the X-Y plane every pixel or every sub-pixel.

(5) In the present disclosure, the hole injection layer and the ITO (or IZO) layer are not absolutely necessary components. When either of the hole injection layer and the ITO (or IZO) layer is not provided, then the power supply layer of the present disclosure corresponds to the auxiliary wire 105 only.

Also, in the above-described Embodiments, the hole injection layer is formed so as to cover the entire top face of the substrate. However, no limitation is intended. For example, the hole injection layer may be formed over the pixel electrode and the auxiliary wire, or only over pixel electrode. Alternatively, the hole injection layer may be formed so as to cover the side and top faces of the pixel electrode (or of the auxiliary wire).

(6) In the above-described Embodiments, and as shown in FIG. 2A, the pixel electrode 104 and the auxiliary wire 105 are coplanar. However, no limitation is intended to a organic EL display panel to which this description applies. For example, the results described above are also obtainable when the auxiliary wire 105 is formed between the top face of the resin partition layer and the electron injection layer formed thereabove, as this configuration places the resin partition layer in contact with the electron injection layer. Given this configuration, forming the inorganic film between the top face of the resin partition layer and the electron injection layer likewise solves the problem discussed in the present disclosure. That is, the present disclosure is widely applicable to any organic EL display panel having a resin partition layer in contact with an electron injection layer.

Also, as discussed in Variation (5), the hole injection layer is not a necessary component of the present disclosure. Accordingly, in a conventional organic EL display panel 90, the hole injection layer 904 is not strictly necessary for the problem to occur.

(7) Embodiment 1 describes a problem that occurs when the material forming the electron injection layer is at least one of oxidable and hygroscopic, in that the contact resistance gradually increases. However, the above problem is likely to occur not only when the entire electron injection layer is oxidable or hygroscopic, but also whenever the material used in a region, or more, of the electron injection layer that is in contact with the resin partition has these properties. That is, the present disclosure is applicable to situations where the region having the oxidable or hygroscopic material is in contact with the resin partition at the electron injection layer.

(8) The effect described in Embodiment 2 does not necessarily require a configuration in which the entirety of the inorganic film is formed from a material that is more oxidable or hygroscopic than the material used for the electron injection layer. At minimum, the effect of the outgassing from the resin partition layer adhering to the inorganic film occurs when the material used to form at least the region of the inorganic film that is in contact with the resin partition is more oxidable or hygroscopic than the material used to form the electron injection layer.

When the entirety of the inorganic film is formed from the material that is more oxidable or more hygroscopic than the material used for the electron injection layer, the following effects are expected. For example, the intrusion of water or oxygen from the common electrode-facing side is likely to cause oxidation in the alkali metal or the like within the electron injection layer. In such cases, having the inorganic film be in contact with the electron injection layer enables the oxidised alkali metal or the like to be reduced and thus return to being an elemental alkali metal.

(9) In the present disclosure, the finished substrate after the resin partition layer formation step refers to both (1) the substrate after the formation of the resin partition layer and before the formation of the organic light-emitting layer, and (2) the substrate after the formation of the resin partition layer and of the organic light-emitting layer and before the formation of the electron injection layer. The substrate shown in FIG. 5D corresponds to case (1) while the substrate shown in FIG. 6A corresponds to case (2). In Example 1 of the manufacturing method described above, the inorganic film 109 is formed over a substrate corresponding to case (2). In Example 2, the inorganic film 109 is formed over a substrate corresponding to case (1).

(10) The manufacturing steps shown in FIGS. 6A, 6B, and 6C pertain to the formation of the inorganic film 109 after the organic light-emitting layer 108 has been formed. However, no limitation is intended. The inorganic film 109 may be formed prior to organic light-emitting layer 108 formation. Also, the manufacturing steps shown in FIGS. 8A, 8B, 9A, and 9B pertain to the formation of the inorganic film 109 before the organic light-emitting layer 108 has been formed. However, no limitation is intended. The inorganic film 109 may be formed after organic light-emitting layer 108 formation. The same applies to the manufacturing steps illustrated in FIGS. 13A, 13B, 14A, 14B, and 14C.

(11) The manufacturing methods for the organic EL display panel described in the above Embodiments are simply intended as examples. The layers described as formed using a vacuum thin-film coating method may also be formed using an application method, such as the ink jet method. Conversely, layers described as formed using the ink-jet method may also be formed using a vacuum thin-film coating method.

(12) In the above-described Embodiments, the materials and dimensions thereof are given solely as examples. No particular limitation is intended. Also, further variations are also applicable, provided that the technical scope of the present disclosure is not exceeded thereby. In addition, the dimensions of the materials given in the drawings differ from those of real materials. All ranges of dimensions given above are intended to include the end points.

INDUSTRIAL APPLICABILITY

The organic EL display panel and so on of the present invention is applicable to an organic EL display panel used in public and private installations, as well as in various forms of business displays, television devices, screens in portable electronic terminals, and so on.

REFERENCE SIGNS LIST

1 Organic electroluminescence display device
10, 10A, 10B, 10C Organic electroluminescence display panel
20 Drive control unit
21, 22, 23, 24 Drive circuits
25 Control circuit
100, 100A, 100B, 100C, 100D Organic electroluminescence display panel
101 Substrate
102 TFT substrate
103 Inter-layer insulation film
104 Pixel electrode (anode)
105 Auxiliary wire
106 Hole injection layer
107 Resin partition layer
107a Edge portion
108 Organic light-emitting layer
109, 109A, 109B, 109C, 117 Inorganic film
110 Electron injection layer
111 Common electrode (cathode)
112, 112R, 112G, 112B Aperture over pixel electrode
113 Aperture over auxiliary wire
201 Auxiliary wire
202 ACL layer
203 IZO layer 204 Hole injection layer
205 Resin partition layer
206, 211 Electron injection layer
207, 212 Common electrode
208 Sealing layer
209 Casing
210 Inorganic partition layer
213 Inorganic film
90 Organic electroluminescence display panel
901 Substrate
902 Pixel electrode (anode)
903 Wiring
904 Hole injection layer
905 Resin partition layer
906 Organic light-emitting layer
907 Functional layer
908 Common electrode (cathode)

The invention claimed is:

1. An organic electroluminescence display panel having an organic light-emitting layer disposed between a pair of electrodes that includes a pixel electrode and a common electrode, the organic electroluminescence display panel comprising:
    a substrate;
    the pixel electrode, formed over the substrate;
    a power supply layer supplying electric power to the common electrode, formed over the substrate with separation from the pixel electrode;
    a resin partition layer partitioning a formation area for the organic light-emitting layer, disposed over the substrate and having an opening over the pixel electrode and an opening over the power supply layer;
    the organic light-emitting layer, formed in the opening over the pixel electrode so as to cover a portion of the pixel electrode exposed through the opening over the pixel electrode;
    a functional layer in contact with the organic light-emitting layer and electrically connected to a portion of the power supply layer exposed through the opening over the power supply layer, formed so as to cover the resin partition layer; and
    the common electrode, formed over the functional layer,
    wherein an inorganic film is disposed between the functional layer and side walls of the opening over the power supply layer.

2. The organic electroluminescence display panel of claim 1,
    wherein the inorganic film further extends from the side walls of the opening over the power supply layer to a top face of the resin partition layer.

3. The organic electroluminescence display panel of claim 1,
    wherein the material forming at least a portion of the inorganic film that is in contact with the resin partition layer includes any of aluminium, silver, copper, and magnesium.

4. The organic electroluminescence display panel of claim 1,
    wherein the functional layer is an electron injection layer.

5. The organic electroluminescence display panel of claim 1, further comprising:
    a hole injection layer disposed between the pixel electrode and the organic light-emitting layer,
    wherein the power supply layer includes:
        a wire formed over the substrate; and
        a layer of a material similar to the hole injection layer; formed so as to cover the wire.

6. The organic electroluminescence display panel of claim 1,
    wherein the inorganic film is not disposed over the pixel electrode.

7. The organic electroluminescence display panel of claim 1,
    wherein the inorganic film is not in contact with the organic light-emitting layer.

8. The organic electroluminescence display panel of claim 1,
    wherein the inorganic film is not along the side walls of the opening over the pixel electrode.

9. The organic electroluminescence display panel of claim 1,
    wherein the inorganic film further extends from the side walls of the opening over the power supply layer to a top face of the power supply layer.

10. The organic electroluminescence display panel of claim 9,
    wherein the inorganic film further extends from the side walls of the opening over the power supply layer to a top face of the resin partition layer.

11. The organic electroluminescence display panel of claim 1,
    wherein a material forming the inorganic film is a conducting material, and
    the inorganic film further extends from the side walls of the opening over the power supply layer to a top face of the power supply layer so as to entirely cover the portion of the power supply layer exposed through the opening over the power supply layer.

12. The organic electroluminescence display panel of claim 11,
    wherein the inorganic film further extends from the side walls of the opening over the power supply layer to a top face of the resin partition layer.

13. The organic electroluminescence display panel of claim 1,
    wherein a material forming the functional layer is at least one of oxidable and hygroscopic, and
    a material forming at least a portion of the inorganic film that is in contact with the resin partition layer is:
        more oxidable than the material forming the functional layer when the material forming the functional layer is oxidable, and
        more hygroscopic than the material forming the functional layer when the material forming the functional layer is hygroscopic.

14. The organic electroluminescence display panel of claim 13,
    wherein the functional layer includes an alkali metal or an alkali earth metal, and
    the material forming at least a portion of the inorganic film that is in contact with the resin partition layer oxides more easily in the presence of oxygen or water than the material forming the functional layer.

* * * * *